United States Patent
Yamamoto et al.

(10) Patent No.: US 10,868,533 B2
(45) Date of Patent: Dec. 15, 2020

(54) CAPACITIVE MULTI-SWITCH DEVICE WITH COMMON METAL PLATE AND ELECTRONIC MACHINE

(71) Applicant: Panasonic Intellectual Property Management Co., Ltd., Osaka (JP)

(72) Inventors: Masami Yamamoto, Osaka (JP); Yukinobu Tokoro, Osaka (JP); Shohei Kawagoe, Osaka (JP); Kojiro Kawasaki, Osaka (JP); Tadayoshi Okuda, Osaka (JP); Yosuke Shiota, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/523,845

(22) Filed: Jul. 26, 2019

(65) Prior Publication Data

US 2019/0346959 A1 Nov. 14, 2019

Related U.S. Application Data

(63) Continuation of application No. PCT/JP2017/030652, filed on Aug. 28, 2017.

(30) Foreign Application Priority Data

Mar. 31, 2017 (JP) .................................. 2017-071897
Jul. 28, 2017 (JP) .................................. 2017-146952

(51) Int. Cl.
*H03K 17/96* (2006.01)
*G06F 3/041* (2006.01)
(Continued)

(52) U.S. Cl.
CPC .......... *H03K 17/9622* (2013.01); *G01L 1/142* (2013.01); *G01L 5/0038* (2013.01);
(Continued)

(58) Field of Classification Search
CPC ...... G06F 3/0414; G06F 3/044; G06F 3/0038; G06F 3/02; G06F 3/041; G06F 3/0338;
(Continued)

(56) References Cited

U.S. PATENT DOCUMENTS 3,696,908 A * 10/1972 Gluck ........................ B41J 5/08
400/479.1
4,228,330 A 10/1980 Larson
(Continued)

FOREIGN PATENT DOCUMENTS

JP 2004-112074 4/2004
JP 2007-122891 5/2007
(Continued)

OTHER PUBLICATIONS

International Search Report of PCT application No. PCT/JP2017/030652 dated Nov. 28, 2017.
(Continued)

*Primary Examiner* — Darlene M Ritchie
(74) *Attorney, Agent, or Firm* — McDermott Will & Emery LLP

(57) ABSTRACT

Electrodes and regions of top plate opposed to electrodes constitute switches that have capacitances varying when the regions of top plate are depressed from top plate toward electrodes. Depression detection circuit calculates the capacitance change amounts of switches indicating changes of the capacitances from a reference value. Depression detection circuit calculates the maximum value and sum of the capacitance change amounts of switches. When the capacitance change amount of at least one switch exceeds
(Continued)

threshold and a situation in which the ratio of the maximum value to the sum is equal to or greater than threshold has lasted for the number of repetitions in, depression detection circuit determines that the switch having the maximum value of the capacitance change amount is in a depressed state.

19 Claims, 20 Drawing Sheets

(51) Int. Cl.
    *G06F 3/044*     (2006.01)
    *H03K 17/975*     (2006.01)
    *H03K 17/98*     (2006.01)
    *G01L 5/00*     (2006.01)
    *G01L 1/14*     (2006.01)

(52) U.S. Cl.
    CPC ............ *G06F 3/044* (2013.01); *G06F 3/0414* (2013.01); *H03K 17/975* (2013.01); *H03K 17/98* (2013.01); *G06F 2203/04105* (2013.01); *H03K 2217/9401* (2013.01); *H03K 2217/96071* (2013.01); *H03K 2217/960745* (2013.01); *H03K 2217/960755* (2013.01)

(58) Field of Classification Search
    CPC .......... G06F 2203/04105; H03K 17/98; H03K 17/965; H03K 17/975; H03K 17/962; H03K 17/9622; H03K 2217/9401; H03K 2217/96071; H03K 2217/960755; H03K 2217/960745; G01L 1/142; H01H 13/00; H01H 13/81; H01H 36/00
See application file for complete search history.

(56) References Cited

U.S. PATENT DOCUMENTS

| | | | | |
|---|---|---|---|---|
| 8,395,590 | B2* | 3/2013 | Fisher | G06F 3/0362 345/173 |
| 2006/0243462 | A1 | 11/2006 | Schilling et al. | |
| 2008/0202824 | A1* | 8/2008 | Philipp | G06F 3/02 178/18.01 |
| 2009/0027333 | A1* | 1/2009 | Orsley | G06F 3/0362 345/157 |
| 2011/0096025 | A1* | 4/2011 | Slobodin | G06F 3/0447 345/174 |
| 2013/0050075 | A1* | 2/2013 | Lin | G06F 3/0338 345/157 |
| 2013/0175148 | A1* | 7/2013 | Hisatsugu | H01H 59/00 200/181 |
| 2013/0229193 | A1* | 9/2013 | Kakimoto | B81B 3/0086 324/661 |
| 2014/0253503 | A1 | 9/2014 | Ejlersen | |
| 2015/0097614 | A1* | 4/2015 | Routamaa | H03K 17/9625 327/517 |
| 2018/0039351 | A1* | 2/2018 | Zhu | H03K 17/975 |

FOREIGN PATENT DOCUMENTS

| | | |
|---|---|---|
| JP | 2009-238701 | 10/2009 |
| JP | 2009-258946 | 11/2009 |
| JP | 2015-133206 | 7/2015 |

OTHER PUBLICATIONS

The Extended European Search Report dated Feb. 26, 2020 for the related European Patent Application No. 17903711.4.

* cited by examiner

CAPACITIVE MULTI-SWITCH DEVICE WITH COMMON METAL PLATE AND ELECTRONIC MACHINE

TECHNICAL FIELD

The present invention relates to a switch device that has no automatic drive mechanism and an electronic machine including the switch device.

BACKGROUND ART

Some switch devices have no automatic drive mechanism, such as switch devices including a touch sensor. For example, U.S. Patent No. 2014/0253503 (PTL 1) describes the invention of a switch device that has no automatic drive mechanism. The switch device described in PTL 1 includes a metal plate and a conductor pad opposed to each other, which detects a user input by detecting a change in capacitance between the metal plate and the conductor pad when the user depresses the metal plate.

SUMMARY OF THE INVENTION

In a switch device having no automatic drive mechanism, when a plurality of switches is formed by one common metal plate, it may be wrongly detected which of the switches has been operated by the user unless a sufficient distance is provided between the switches. Therefore, it is required to detect a user input with higher accuracy than conventional.

An object of the present invention is to provide a switch device having no automatic drive mechanism that detects a user input with higher accuracy than conventional.

A switch device according to an aspect of the present invention is a switch device includes:

a first electrode that is formed from a metal plate;

a plurality of second electrodes that is opposed to and capacitatively coupled to the first electrode; and a detection circuit that detects capacitances between the first electrode and the plurality of second electrodes.

The plurality of second electrodes and regions of the first electrode opposed to the second electrodes constitute a plurality of switches that has the capacitances varying when the regions of the first electrode are depressed from the first electrode toward the second electrodes.

The detection circuit calculates capacitance change amounts indicating changes of the capacitances of the switches from a reference value, calculates a maximum value and a sum of the capacitance change amounts of the switches, and when the capacitance change amount of at least one switch of the plurality of switches exceeds a first threshold and a state in which a ratio of the maximum value to the sum is equal to or greater than a second threshold has lasted for a first period, determines that the switch with the maximum value of the capacitance change amount is in a depressed state.

In the switch device according to an aspect of the present invention, it is possible to detect a user input with higher accuracy than conventional by detecting that the capacitance change amount of at least one switch exceeds the first threshold and that the state in which the ratio of the maximum value to the sum is equal to or greater than the second threshold lasts for the first period.

DESCRIPTION OF EMBODIMENTS

Hereinafter, switch devices according to exemplary embodiments of the present disclosure will be described with reference to the drawings. However, descriptions in more detail than necessary may be omitted. For example, a detailed description of a matter which is already well-known, or a repetitive description for a substantially identical configuration may be omitted. This is to avoid unnecessarily redundancy in the following description, and to facilitate understanding by those skilled in the art. The inventors provide the accompanying drawings and the following description to help those skilled in the art sufficiently understand the present disclosure, and therefore have no intention to put any limitation by those drawings and description on subject matters described in claims.

1. First Exemplary Embodiment

A switch device according to a first exemplary embodiment will be described with reference to FIGS. 1 to 13.

[1-1. Configuration]

Figure 1:
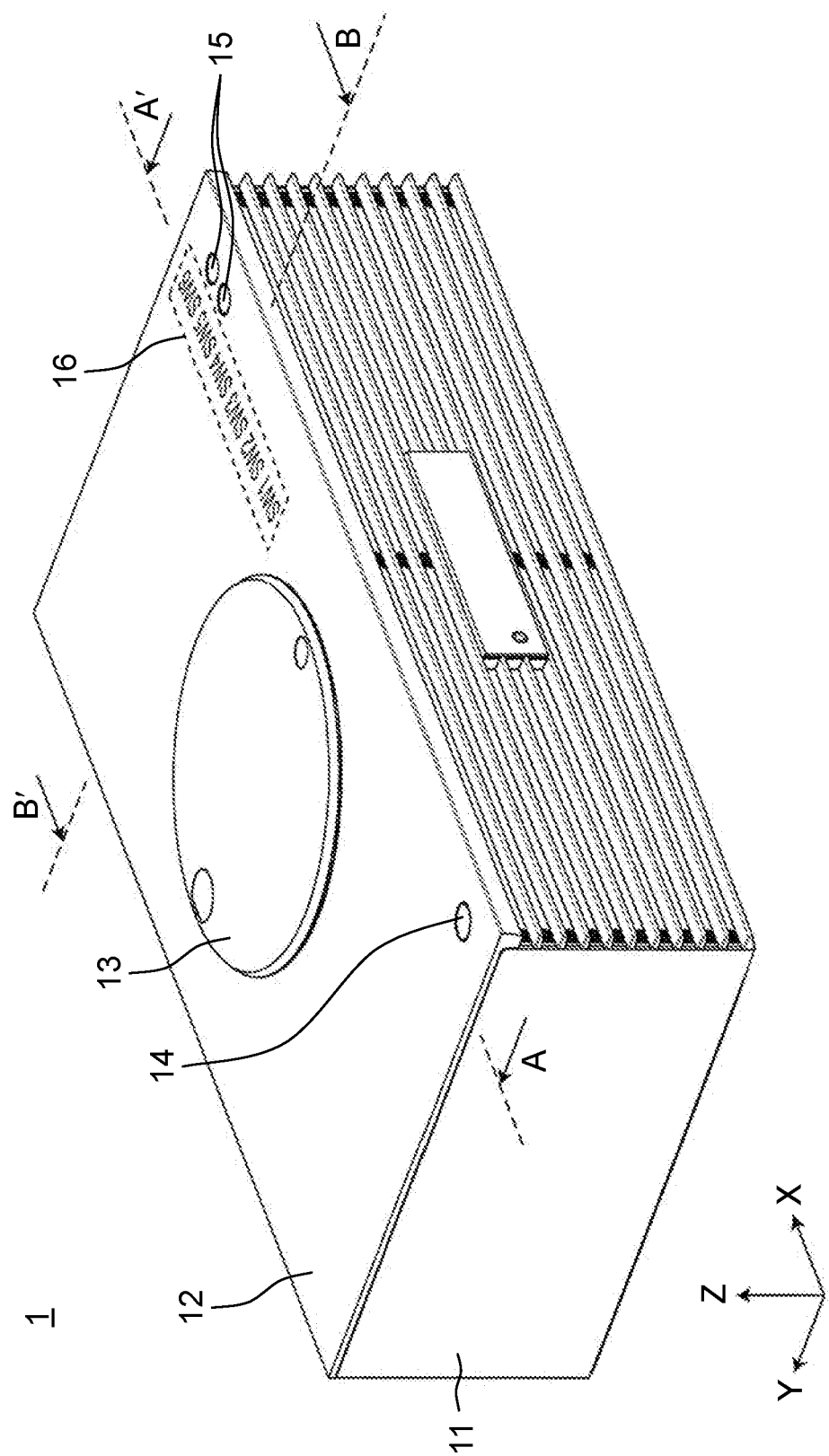
FIG. 1 is a perspective view of outer appearance of electronic machine 1 according to a first exemplary embodiment.

FIG. 1 is a perspective view of outer appearance of electronic machine 1 according to the first exemplary embodiment. Electronic machine 1 is a music reproduction device including a compact disc (CD) drive and a speaker, for example.

As illustrated in FIG. 1, electronic machine 1 includes lower housing 11, top plate 12, lid 13, power switch 14, volume switch 15, and switch array 16. Lower housing 11 and top plate 12 constitute a housing of electronic machine 1. Top plate 12 is formed from a metal (for example, aluminum). Lid 13 openably covers an opening in top plate 12. Through this opening, a CD is put into or taken from a CD drive in electronic machine 1. Power switch 14 accepts a user input for powering on or off electronic machine 1. Volume switch 15 accepts a user input for increasing or decreasing volume of sound to be reproduced by electronic machine 1. Switch array 16 accepts user inputs for performing other functions of electronic machine 1 such as reproduction, stop, pause, fast-forward, and fast-backward of a CD. Switch array 16 includes a plurality of switches SW1 to SW6 that has no automatic drive mechanism.

Figure 2:
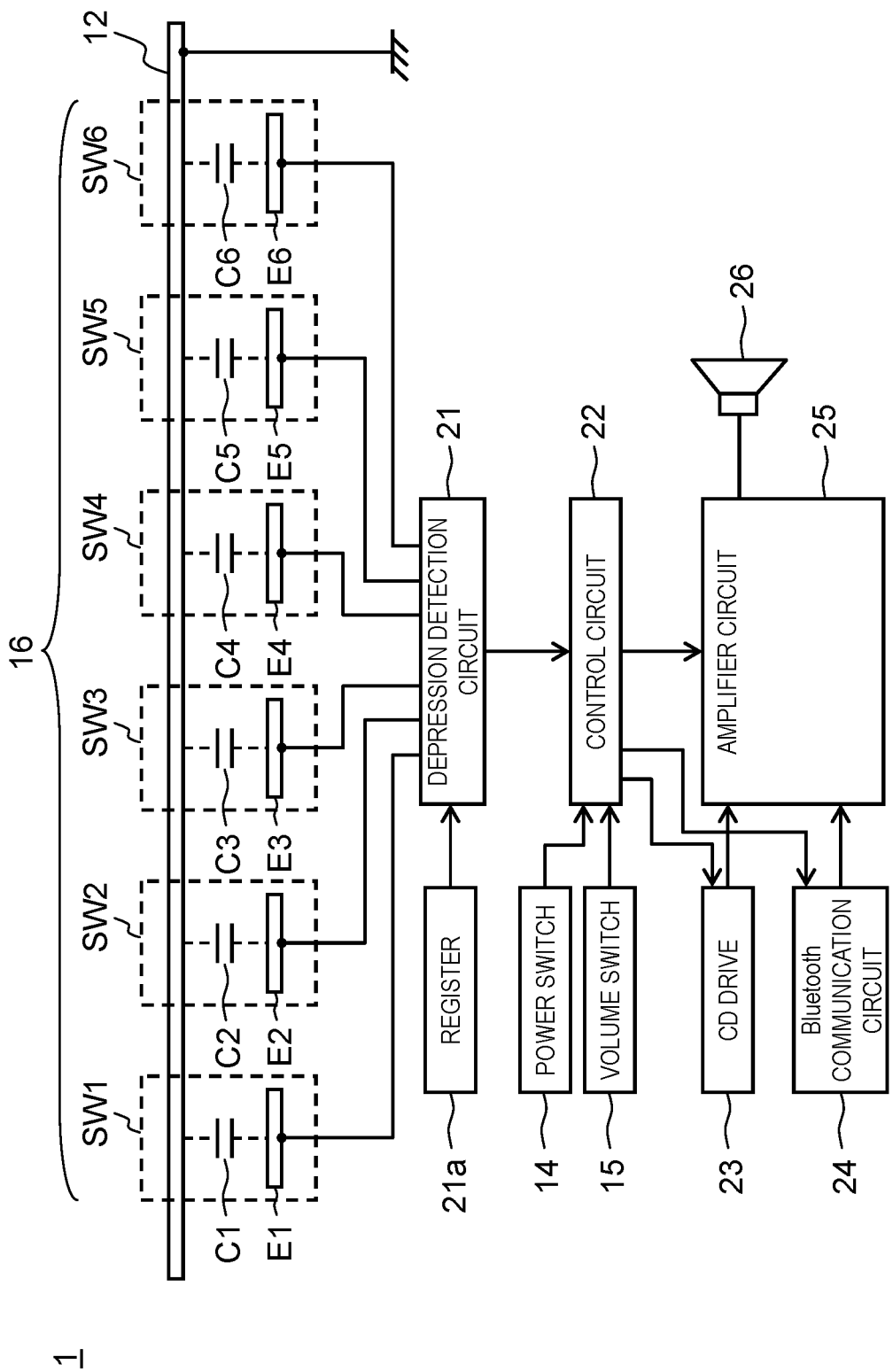
FIG. 2 is a block diagram illustrating an internal configuration of electronic machine 1 illustrated in FIG. 1.

FIG. 2 is a block diagram illustrating an internal configuration of electronic machine 1 illustrated in FIG. 1. In addition to the constituent elements illustrated in FIG. 1, electronic machine 1 includes depression detection circuit 21, register 21a, control circuit 22, CD drive 23, Bluetooth (registered trademark, which is applied to the following description) communication circuit 24, amplifier circuit 25, and speaker 26 as illustrated in FIG. 2.

As illustrated in FIG. 2, top plate 12 is formed in a plate shape at a position of switch array 16. Top plate 12 is grounded. Switch array 16 includes a plurality of electrodes E1 to E6 that is opposed to and capacitatively coupled to top plate 12 formed of a metal plate. The plurality of electrodes E1 to E6 is aligned in a straight line with predetermined space between the electrodes. The plurality of electrodes E1 to E6 and regions of top plate 12 opposed to electrodes E1 to E6 constitute the plurality of switches SW1 to SW6 that has capacitances changing due to depression of the regions of top plate 12 from top plate 12 toward electrodes E1 to E6. The capacitances of switches SW1 to SW6 are represented as virtual capacitances C1 to C6. Electrodes E1 to E6 are connected to depression detection circuit 21.

Depression detection circuit 21 detects capacitances C1 to C6 between top plate 12 and the plurality of electrodes E1 to E6, and based on capacitances C1 to C6, determines whether switches SW1 to SW6 are in a depressed state (touched) or in a non-depressed state (released). Register 21a pre-stores thresholds, correction coefficients, capacitance reference levels for depression detection circuit 21 to determine whether switches SW1 to SW6 are in the depressed state or in the non-depressed state. Control circuit 22 controls overall operations of electronic machine 1 depending on the depressed states and non-depressed states of power switch 14, volume switch 15, and switches SW1 to SW6 of switch array 16. CD drive 23 replays a CD and sends sound signals recorded on the CD to amplifier circuit 25 under control of control circuit 22. Bluetooth communication circuit 24 communicates with a reproduction device around electronic machine 1 to send the sound signals received from the reproduction device to amplifier circuit 25 under control of control circuit 22. Amplifier circuit 25 amplifies the sound signals received from CD drive 23 or Bluetooth communication circuit 24 and outputs the same from speaker 26 under control of control circuit 22. Speaker 26 may be a speaker built in electronic machine 1, may be an external speaker, or may be a combination of a built-in speaker and an external speaker.

Switches SW1 to SW6 of switch array 16 and depression detection circuit 21 are also called herein "switch device". Features of the switch device will be described. Control circuit 22, CD drive 23, Bluetooth communication circuit 24, and amplifier circuit 25 are electronic circuits that operate depending on the depressed states and non-depressed states of switches SW1 to SW6 of the switch device.

Figure 3:
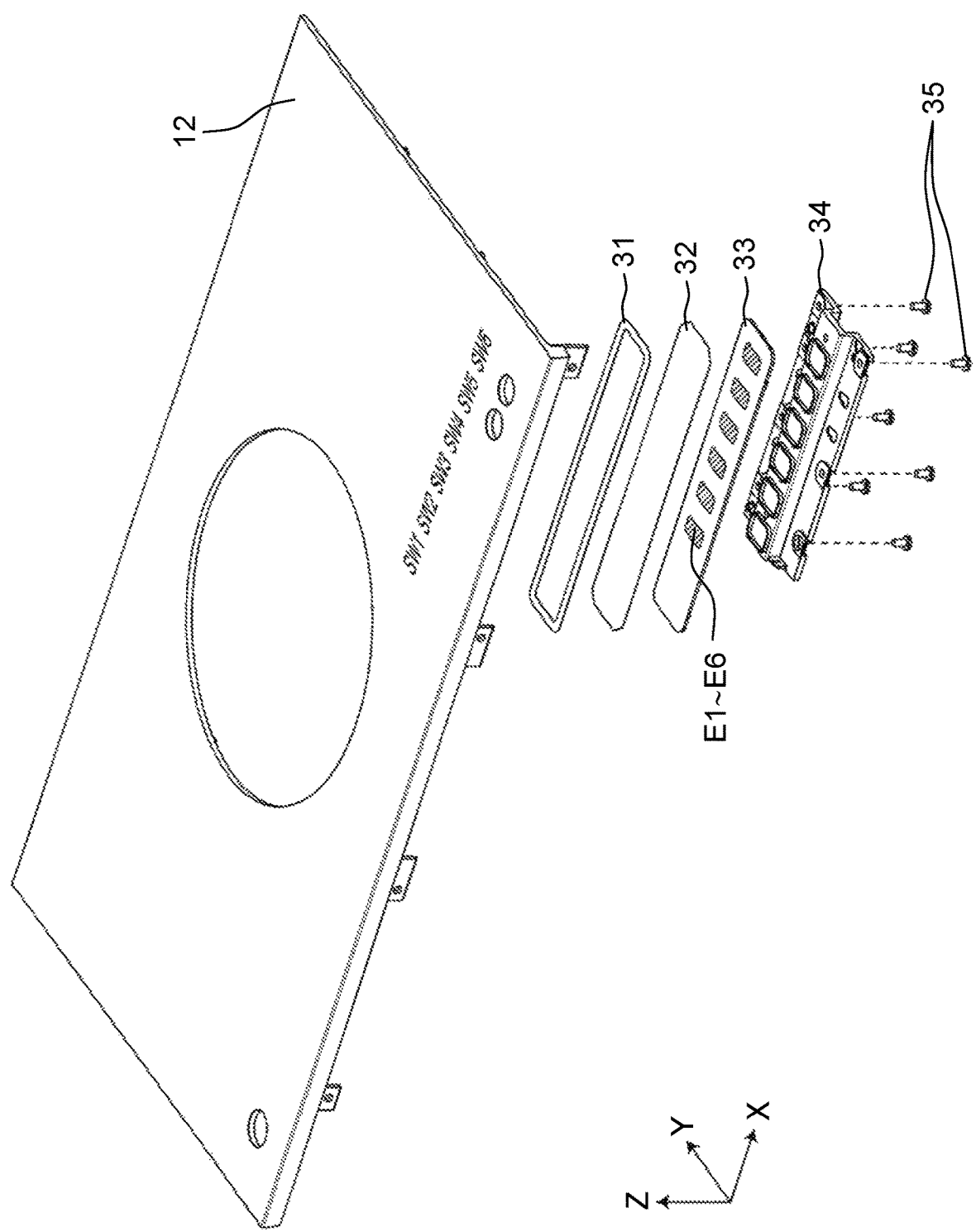
FIG. 3 is an exploded perspective view of constituent elements of switch array 16 illustrated in FIG. 1.
Figure 4:
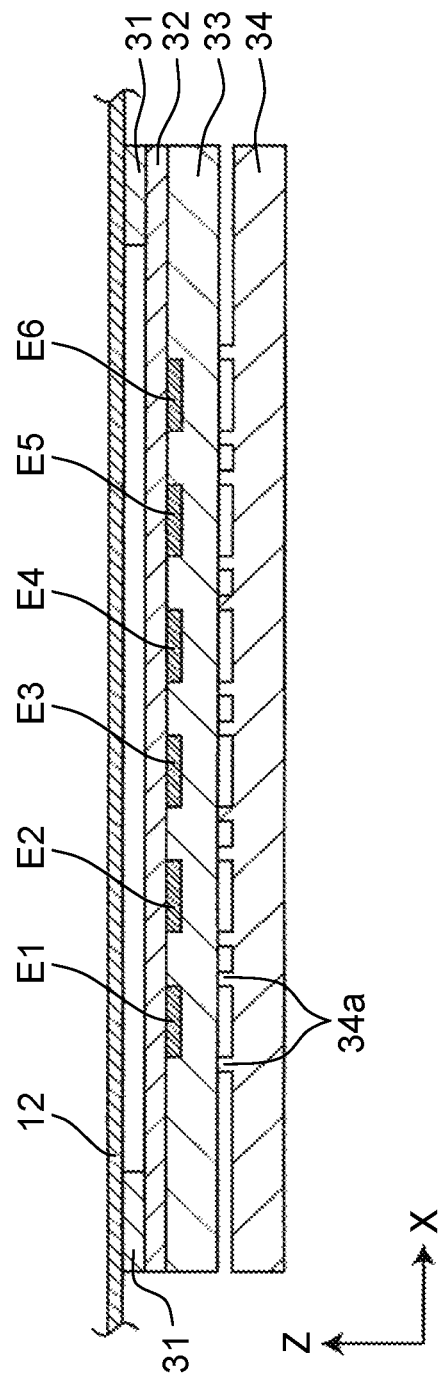
FIG. 4 is a cross-sectional view of part of a cross section of electronic machine 1 taken along line A-A' illustrated in FIG. 1.
Figure 5:
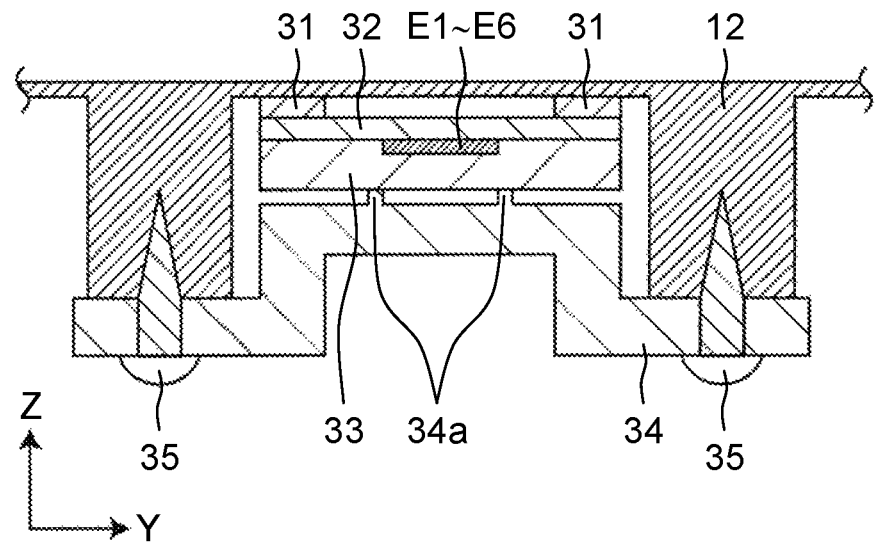
FIG. 5 is a cross-sectional view of part of a cross section of electronic machine 1 taken along line B-B' illustrated in FIG. 1.

FIG. 3 is an exploded perspective view of constituent elements of switch array 16 illustrated in FIG. 1. FIG. 4 is a cross-sectional view of part of a cross section of electronic machine 1 taken along line A-A' illustrated in FIG. 1. FIG. 5 is a cross-sectional view of part of a cross section of electronic machine 1 taken along line B-B' illustrated in FIG. 1.

As illustrated in FIGS. 3 to 5, switch array 16 includes dielectric members 31, 32, printed circuit board 33, and fixing member 34 in addition to top plate 12.

Printed circuit board 33 has a first surface (top surface illustrated in FIGS. 3 to 5) and a second surface (bottom surface illustrated in FIGS. 3 to 5). The first surface is opposed to top plate 12. Electrodes E1 to E6 are formed on the first surface.

Dielectric members 31, 32 are provided between top plate 12 and printed circuit board 33, and are formed so as not to be in contact with the regions of top plate 12 opposed to electrodes E1 to E6. For example, dielectric member 32 may be formed to cover the first surface of printed circuit board 33, and dielectric member 31 may be provided between top plate 12 and dielectric member 32. In this case, dielectric member 31 is formed in such a manner as not to be in contact with the regions of top plate 12 opposed to electrodes E1 to E6 but as to be in contact with top plate 12 around these regions (that is, in one ring shape surrounding switches SW1 to SW6). Accordingly, a hollow region is formed between top plate 12 and dielectric member 32, so that the regions of top plate 12 opposed to electrodes E1 to E6 are easy to depress from top plate 12 toward electrodes E1 to E6. Dielectric members 31, 32 are formed from polyethylene terephthalate, for example, but may be formed from any other material with a desired dielectric constant.

Fixing member 34 fixes printed circuit board 33 and dielectric members 31, 32 to top plate 12. Fixing member 34 has a plurality of projections 34a that is formed to depress the second surface of printed circuit board 33 at positions opposed to outer peripheries of electrodes E1 to E6. Fixing member 34 is fixed to top plate 12 by a plurality of screws 35, for example.

Figure 6:
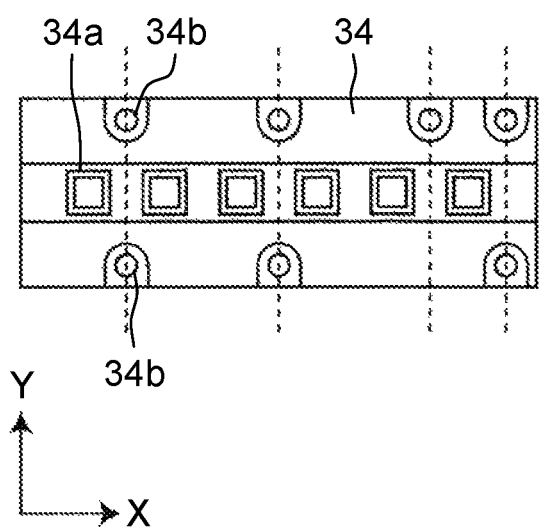
FIG. 6 is a top view of a configuration of fixing member 34 illustrated in FIG. 3.

FIG. 6 is a top view of a configuration of fixing member 34 illustrated in FIG. 3. When fixing member 34 is fixed to top plate 12 by the plurality of screws 35, positions of screws 35 are decided so as not to prevent deformation of top plate 12 when switches SW1 to SW6 are depressed. Therefore, as illustrated in FIG. 6, for example, screw holes 34b are provided at positions at equal distances from two adjacent projections among the plurality of projections 34a. Accordingly, fixing member 34 is screwed to top plate 12 at positions at equal distances from two adjacent electrodes among the plurality of electrodes E1 to E6. Fixing member 34 may be fixed to top plate 12 by any method other than the method illustrated in FIG. 6 so as not to prevent the deformation of top plate 12 when switches SW1 to SW6 are depressed.

Figure 7:
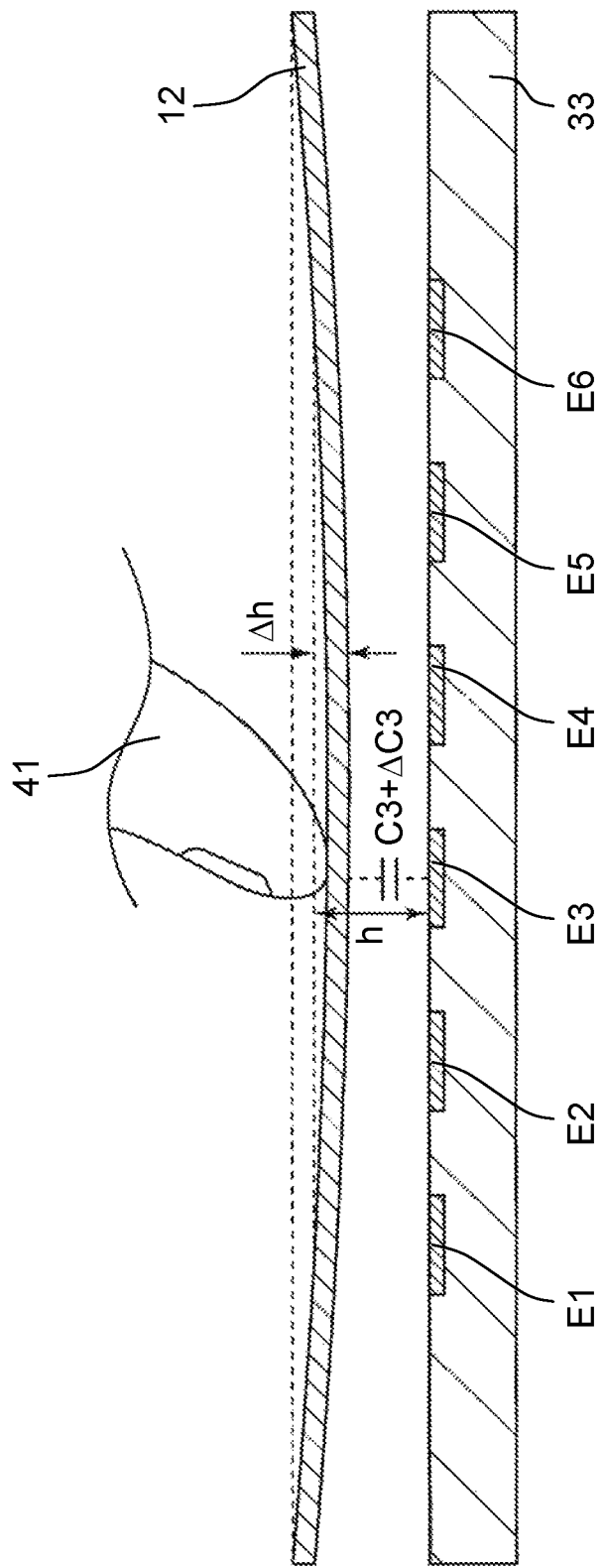
FIG. 7 is a schematic view of switch array 16 with switch SW3 illustrated in FIG. 1 in a depressed state.

FIG. 7 is a schematic view of switch array 16 with switch SW3 illustrated in FIG. 1 in a depressed state. When top plate 12 is not depressed, top plate 12 and electrodes E1 to E6 have distance h, and switch SW3 has capacitance C3. When the region of top plate 12 opposed to electrode E3 is depressed by distance Δh from top plate 12 toward electrode E3 (that is, when switch SW3 is depressed by finger 41), the capacitance of switch SW3 changes to C3+ΔC3. Depression detection circuit 21 detects the capacitance change amount ΔC3 of the switch SW3 to determine whether switch SW3 is in the depressed state or in the non-depressed state.

However, as illustrated in FIG. 7, when the region of top plate 12 opposed to electrode E3 is depressed, the regions of top plate 12 opposed to other electrodes E1, E2, E4 to E6 are also depressed at the same time and the capacitances of switches SW1, SW2, SW4 to SW6 change. When the capacitances of all switches SW1 to SW6 change, it is required to detect the switch depressed by the user with high accuracy.

[1-2. Operations]

Hereinafter, a method for determining whether switches SW1 to SW6 are in the depressed state (touched) or in the non-depressed state (released) in the switch device according to the first exemplary embodiment will be described.

Figure 8:
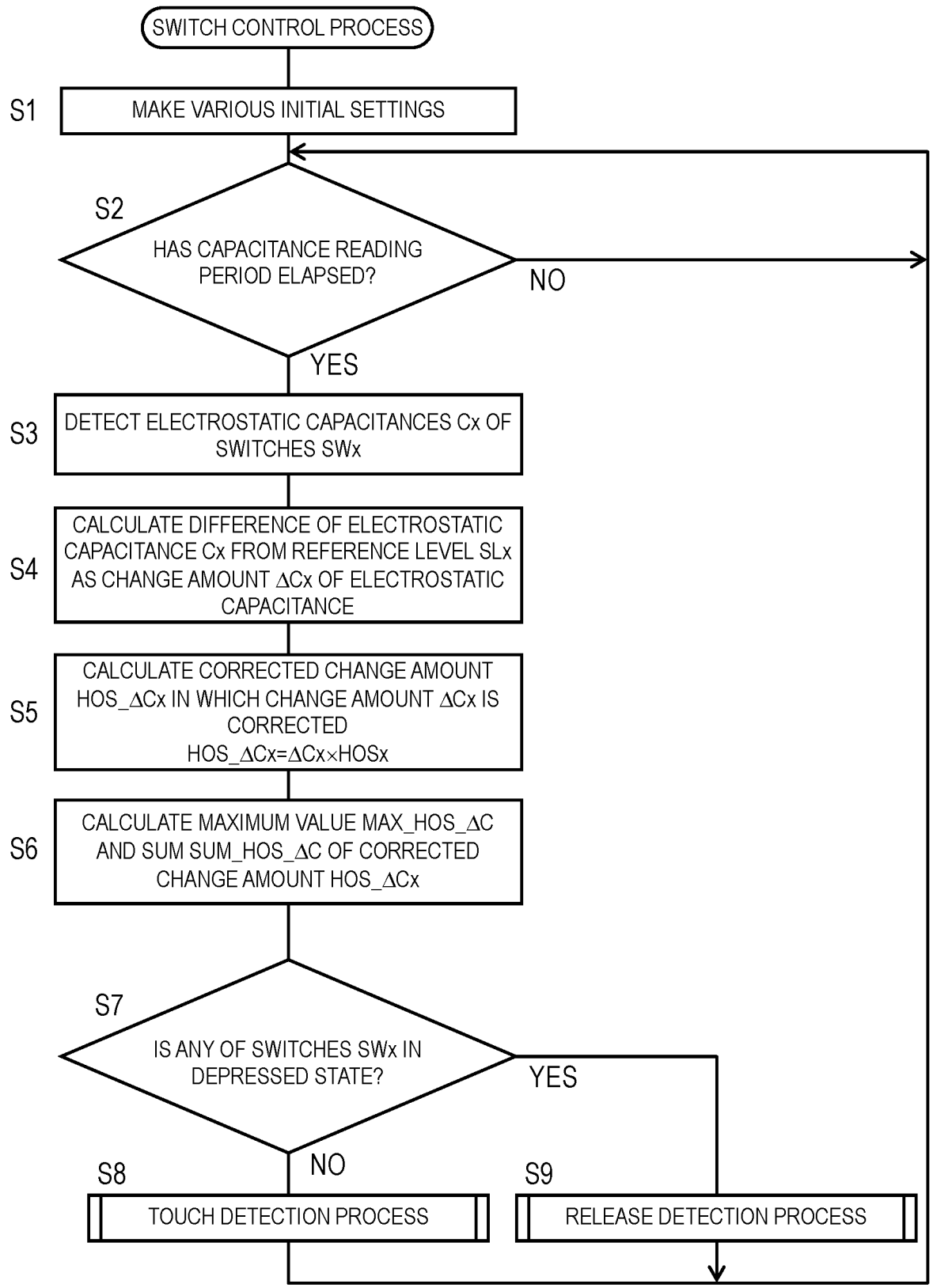
FIG. 8 is a flowchart of a switch control process executed by depression detection circuit 21 illustrated in FIG. 2.

FIG. 8 is a flowchart of a switch control process executed by depression detection circuit 21 illustrated in FIG. 2.

In the switch control process illustrated in FIG. 8, the following parameters are used:

ΔCx (x=1 to 6): electrostatic capacitance change amounts of switches SWx (x=1 to 6) (that is, differences between electrostatic capacitances Cx detected from switches SWx and reference level SLx of electrostatic capacitances of switches SWx).

HOS_ΔCx (x=1 to 6): electrostatic capacitance change amounts corrected by multiplying the electrostatic capacitance change amounts of switches SWx by correction coefficient HOSx described later (hereinafter, called "corrected change amounts").

MAX_HOS_ΔC: maximum value of corrected change amounts HOS_ΔCx (x=1 to 6).

SUM_HOS_ΔC: sum of corrected change amounts HOS_ΔCx (x=1 to 6). In this case, no corrected change amount having a negative value is counted in calculation.

The change amounts and corrected change amounts of electrostatic capacitances of switches SWx will be herein collectively called "capacitance change amount".

In step S1, depression detection circuit 21 reads a plurality of thresholds and a plurality of correction coefficients pre-stored in register 21a, and makes various initial settings. For example, the following thresholds and correction coefficients are used:

TH_ EDGE: threshold of a capacitance change amount for determining that the switch in the non-depressed state has changed to the depressed state. For example, when being represented in a digital value of 0 to 500, the capacitance change amount is set to 30.

TH_FALL: threshold of a capacitance change amount for determining that the switch in the depressed state has changed to the non-depressed state. For example, when being represented in a digital value of 0 to 500, the capacitance change amount is set to 30.

TH_LOW: threshold of a negative capacitance change amount for determining that the capacitance of certain switch SWx is in an abnormal state. For example, when being represented in a digital value of −500 to 0, the negative capacitance change amount is set to −30.

ABt: threshold of a duration time during which the capacitance change amount falls below threshold TH_LOW for determining that the capacitance of certain switch SWx is in an abnormal state (calibration determination time). For example, the threshold of the duration time is set to three seconds.

SW_DET_COUNT: threshold of a duration time during which the capacitance change amount exceeds threshold TH_EDGE for determining that the switch in the non-depressed state has changed to the depressed state. In addition, threshold of a duration time during which the capacitance change amount falls below threshold TH_FALL for determining that the switch in the depressed state has changed to the non-depressed state. For example, with the number of repetitions of steps S2 to S9 illustrated in FIG. 8 (that is, a time length of a cycle of reading the capacitance) as a unit, the threshold is set to two.

Lt: threshold for determining that switch SWt having a long-depressing operation has been long-depressed.

HOSx (x=1 to 6): correction coefficients by which the electrostatic capacitance change amounts of switches SWx are multiplied. Correction coefficients HOSx are set independently to switches SWx. For example, when correction coefficients change within a range of 0.5 to 2.0 by a step width of 0.1, HOS1=0.8, HOS2=1.0, HOS3=1.1, HOS4=1.1, HOS5=1.0, and HOS6=0.8.

COMP_LEVELx (x=1 to 6): correction coefficient by which sum SUM_HOS_ΔC of the capacitance change amount is multiplied when maximum value MAX_HOS_ΔC and sum SUM_HOS_ΔC of the capacitance change amount are compared with each other and the capacitance change amount of switch SWx is maximum value MAX_HOS_ΔC. In other words, a threshold to be compared with the ratio of maximum value MAX_HOS_ΔC to sum SUM_HOS_ΔC. Correction coefficient COMP_LEVELx is set independently to switch SWx depending on which of switches SWx has maximum value MAX_HOS_ΔC. As correction coefficient COMP_LEVELx becomes larger, maximum value MAX_HOS_ΔC needs to have a value closer to sum SUM_HOS_ΔC in order to determine that switch SWx has been depressed. For example, when the correction coefficients change within a range of 0.20 to 1.00 by a step width of 0.05, COMP_LEVEL1=0.65, COMP_LEVEL2=0.5, COMP_LEVEL3=0.5, COMP_LEVEL4=0.5, COMP_LEVEL5=0.5, and COMP_LEVEL6=0.65.

Correction coefficients HOSx and COMP_LEVELx are decided when sensitivities of switches SWx are adjusted to coincide with each other in a manufacturing process, and are set to register 21a.

Register 21a pre-stores reference level SLx of electrostatic capacitances of switches SWx.

In step S2, depression detection circuit 21 determines whether the pre-determined reading cycle of the capacitances has elapsed. When making a YES determination, depression detection circuit 21 proceeds to step S3, and when making a NO determination, depression detection circuit 21 repeats step S2. Depression detection circuit 21 repeats the following steps S2 to S9 in each reading cycle, and increments a count value of the number of repetitions.

In step S3, depression detection circuit 21 detects electrostatic capacitances Cx of switches SWx. In step S4, depression detection circuit 21 reads reference level SLx of the electrostatic capacitances of switches SWx from register 21a, and calculates differences of electrostatic capacitances Cx from reference level SLx as electrostatic capacitance change amounts ΔCx. In step S5, depression detection circuit 21 calculates corrected change amounts HOS_ΔCx=ΔCx×HOSx by correcting change amounts ΔCx.

In the switch device as in the present exemplary embodiment, even when each of switches SWx is depressed by constant force, an amount of flection of top plate 12 varies mainly depending on the positions of switches SWx, and thus the sensitivity also varies depending on switches SWx. Therefore, it is necessary to adjust the sensitivities of switches SWx to coincide with one another. In the present exemplary embodiment, the sensitivities of switches SWx are adjusted by multiplying capacitance change amounts ΔC of switches SWx by correction coefficients HOSx independently set to switches SWx.

Figure 11:
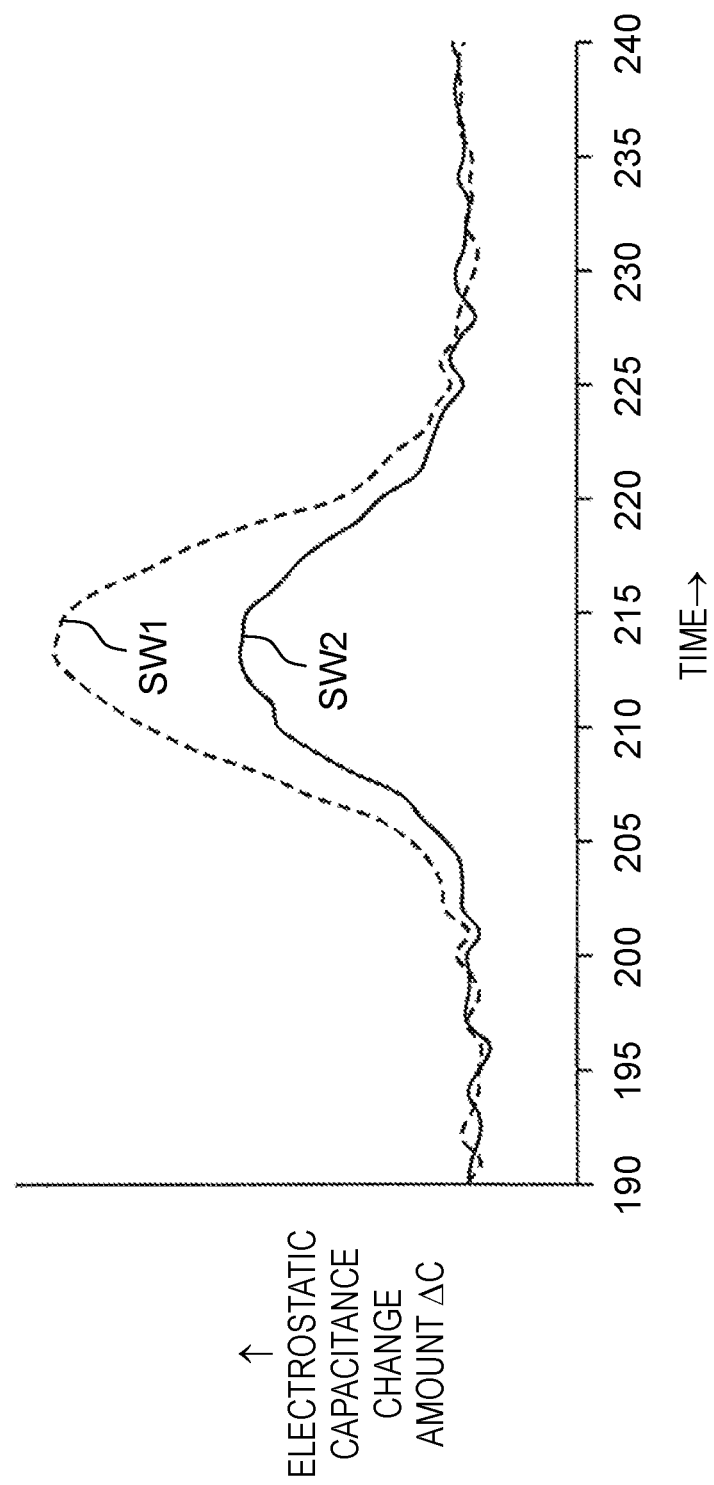
FIG. 11 is a graph illustrating temporal changes in electrostatic capacitance change amounts ΔC of switches SW1, SW2 before correction.
Figure 12:
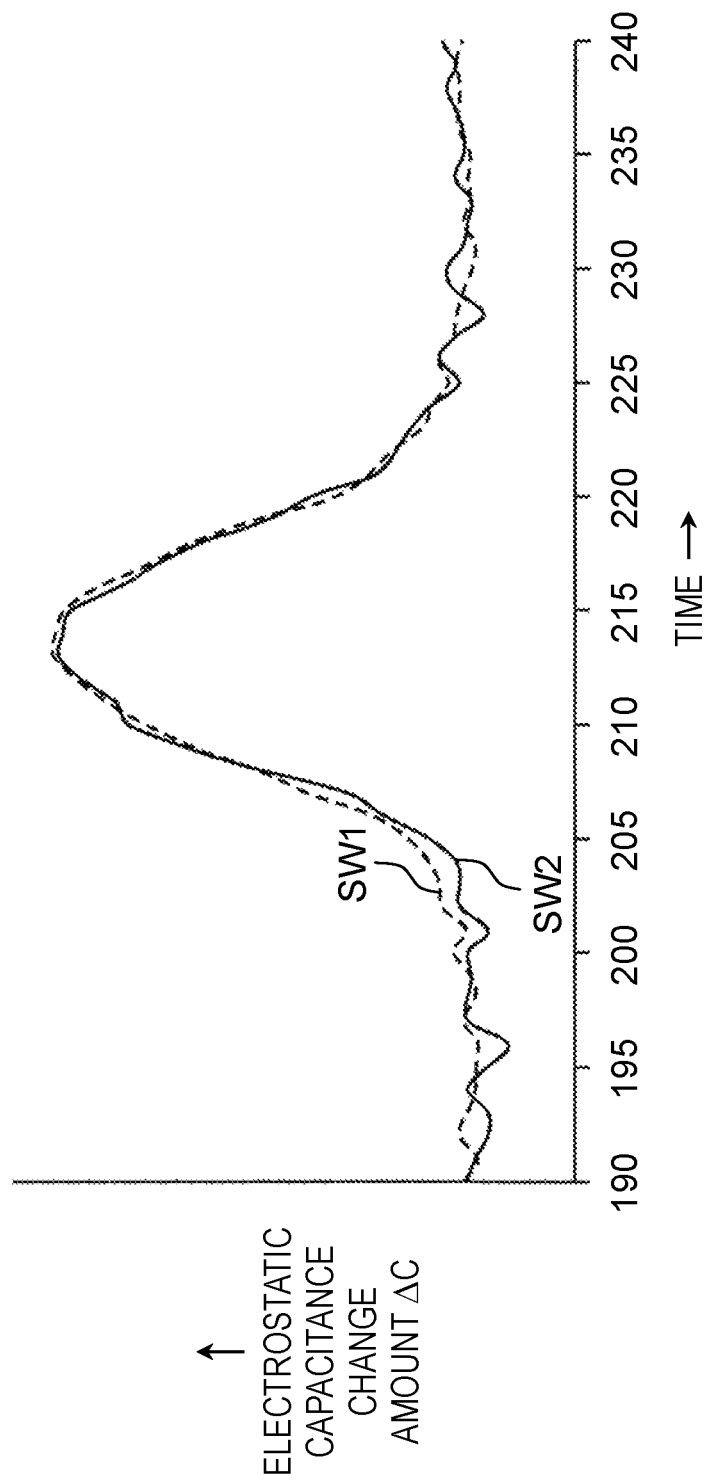
FIG. 12 is a graph illustrating temporal changes in electrostatic capacitance change amounts ΔC of switches SW1, SW2 respectively corrected by correction coefficients HOS1, HOS2.

FIG. 11 is a graph illustrating temporal changes in electrostatic capacitance change amounts ΔC of switches SW1, SW2 before correction. FIG. 12 is a graph illustrating temporal changes in electrostatic capacitance change amounts ΔC of switches SW1, SW2 respectively corrected by correction coefficients HOS1, HOS2. FIG. 11 illustrates a case in which switches SW1, SW2 are depressed by the same force. Referring to FIG. 11, there is an about 1.8-time difference between peak values of capacitance change amounts ΔC of switches SW1, SW2. In this case, the peak values of capacitance change amounts ΔC of switches SW1, SW2 becomes almost equal as illustrated in FIG. 12 by multiplying capacitance change amount ΔC of switch SW1 by correction coefficient HOS1=1.0 and multiplying capacitance change amount ΔC of switch SW2 by correction coefficient HOS2=1.8.

In step S6, depression detection circuit 21 calculates maximum value MAX_HOS_ΔC and sum SUM_HOS_ΔC of corrected change amount HOS_ΔCx.

In step S7, depression detection circuit 21 determines whether it is determined which of switches SWx is in the depressed state or switches SWx are in the non-depressed state. When making a YES determination, depression detection circuit 21 proceeds to step S8, and when making a NO determination, depression detection circuit 21 proceeds to step S9. In step S8, depression detection circuit 21 executes a touch detection process for determining whether switch SWx having been judged as being in the non-depressed state is in the depressed state. In step S9, depression detection circuit 21 executes a release detection process for determining whether switch SWx having been judged as being in the depressed state is in the non-depressed state.

Figure 9:
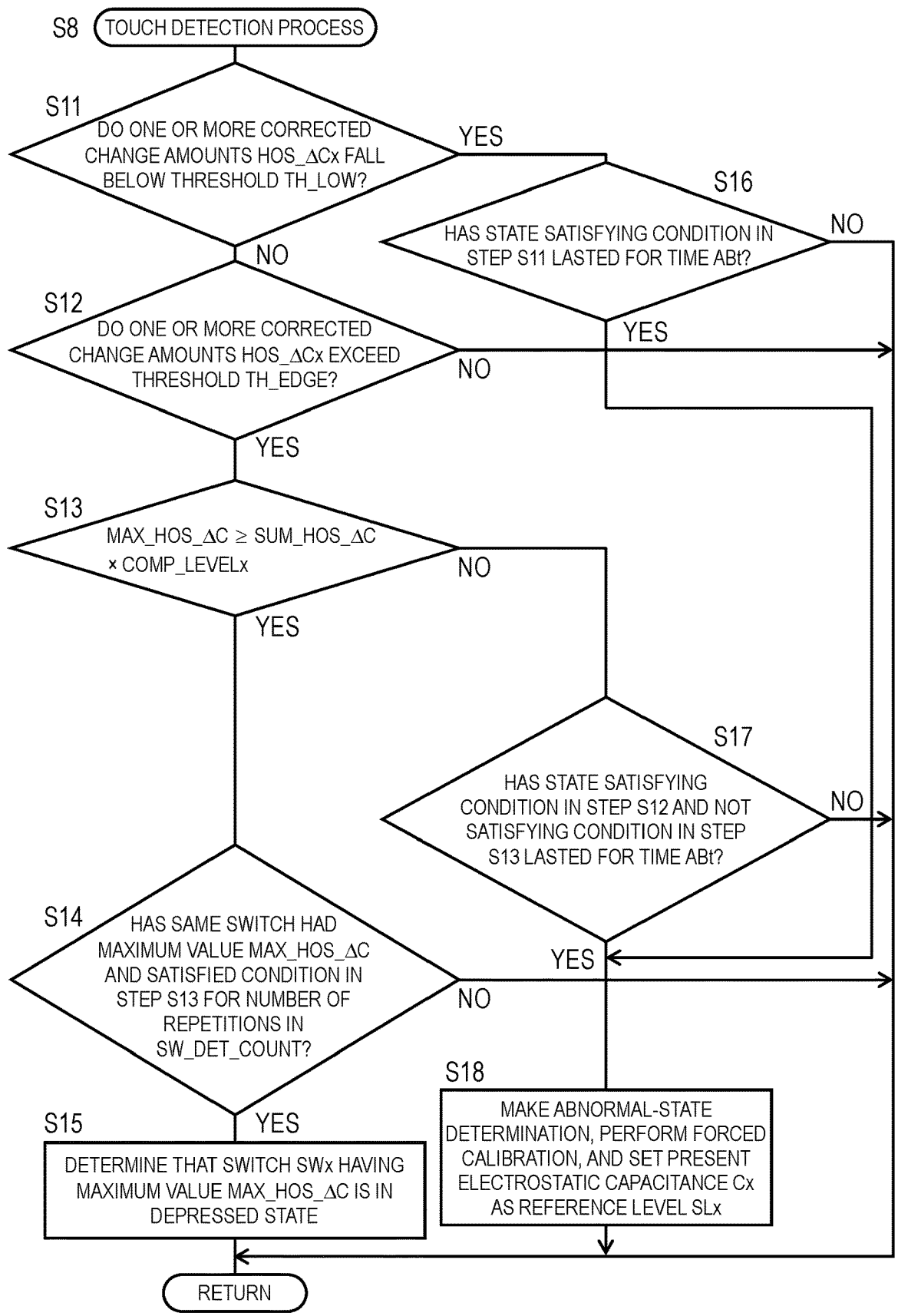
FIG. 9 is a flowchart of a subroutine of a touch detection process (step S8) illustrated in FIG. 8.

FIG. 9 is a flowchart of a subroutine of the touch detection process (step S8) illustrated in FIG. 8.

In step S11, depression detection circuit 21 determines whether one or more corrected change amounts HOS_ΔCx fall below threshold TH_LOW. When making a YES determination, depression detection circuit 21 proceeds to step S16, and when making a NO determination, depression detection circuit 21 proceeds to step S12. Even when the conditions of steps S12 to S14 for determining that any of switches SWx is depressed are satisfied, depression detection circuit 21 determines that the switch is in an abnormal state unless the condition in step S11 is eliminated, and proceeds to step S16. Performing step S11 makes it possible to reduce influence of distortion of top plate 12 caused by depressing top plate 12 outside switch array 16.

In step S12, depression detection circuit 21 determines whether one or more corrected change amounts HOS_ΔCx exceed threshold TH_EDGE. When making a YES determination, depression detection circuit 21 proceeds to step S13, and when making a NO determination, depression detection circuit 21 returns to step S2 illustrated in FIG. 8. In step S13, depression detection circuit 21 determines whether maximum value MAX_HOS_ΔC and sum SUM_HOS_ΔC of the capacitance change amount satisfy the following equation: MAX_HOS_ΔC≥SUM_HOS_ΔC× COMP_LEVELx When making a YES determination in step S13, depression detection circuit 21 proceeds to step S14, and when making a NO determination, depression detection circuit 21 proceeds to step S17.

In step S14, depression detection circuit 21 determines whether the same switch SWx has maximum value MAX_HOS_ΔC and satisfies the condition in step S13 for the number of repetitions in SW_DET_COUNT. Performing step S14 makes it possible to detect only a state in which only one switch SWx has been depressed. When making a YES determination in step S14, depression detection circuit 21 proceeds to step S15, and when making a NO determination, depression detection circuit 21 returns to step S2 illustrated in FIG. 8. In step S15, depression detection circuit 21 determines that switch SWx having maximum value MAX_HOS_ΔC is in the depressed state. After that, depression detection circuit 21 returns to step S2 illustrated in FIG. 8.

In step S16, depression detection circuit 21 determines whether a state satisfying the condition in step S11 has lasted for time ABt. When making a YES determination, depression detection circuit 21 proceeds to step S18, and when making a NO determination, depression detection circuit 21 returns to step S2 illustrated in FIG. 8. When making a YES determination in step S16, depression detection circuit 21 determines that the switch is in an abnormal state where calibration does not work at any time, and performs forced calibration in step S18. Accordingly, it is possible to reduce influence of distortion of top plate 12 caused when the temperature decreases, when any object is placed on top plate 12, or when lid 13 is opened or closed.

In step S17, depression detection circuit 21 determines whether a state in which the condition in step S12 is satisfied and the condition in step S13 is not satisfied has lasted for time ABt. When making a YES determination, depression detection circuit 21 proceeds to step S18, and when making a NO determination, depression detection circuit 21 returns to step S2 illustrated in FIG. 8. When making a YES determination in step S17, depression detection circuit 21 determines that the switch is in an abnormal state where calibration does not work at any time, and performs forced calibration in step S18. Accordingly, it is possible to reduce influence of distortion of top plate 12 caused when the temperature rises or when lid 13 is opened or closed.

In step S18, depression detection circuit 21 determines that the switch is in an abnormal state and performs forced calibration (calibration), and sets present electrostatic capacitance Cx as reference level SLx to register 21a. After that, depression detection circuit 21 returns to step S2 illustrated in FIG. 8.

Some of switches SW1 to SW6 have a long-depressing operation, and others have no long-depressing operation (having only a short-depressing operation). In this case, the long-depressing operation means that electronic machine 1 continues to execute a corresponding action for a time during which switch SWx is judged as being in the depressed state. When switches SW1 to SW6 are assigned to operations such as replay, stop, pause, fast-forward, and fast-backward of a CD, fast-forward and fast-backward are long-depressing operations, and replay, stop, and pause are short-depressing operations. Depression detection circuit 21 causes switches SWx having long-depressing operations to execute corresponding actions when it is determined that switches SWx have been shifted from the depressed state to the non-depressed state and when switches SWx are in the depressed state and are long-depressed. Depression detection circuit 21 causes switches SWx having only short-depressing operations to execute corresponding actions when it is determined that switches SWx have been shifted from the non-depressed state to the depressed state.

Figure 10A:
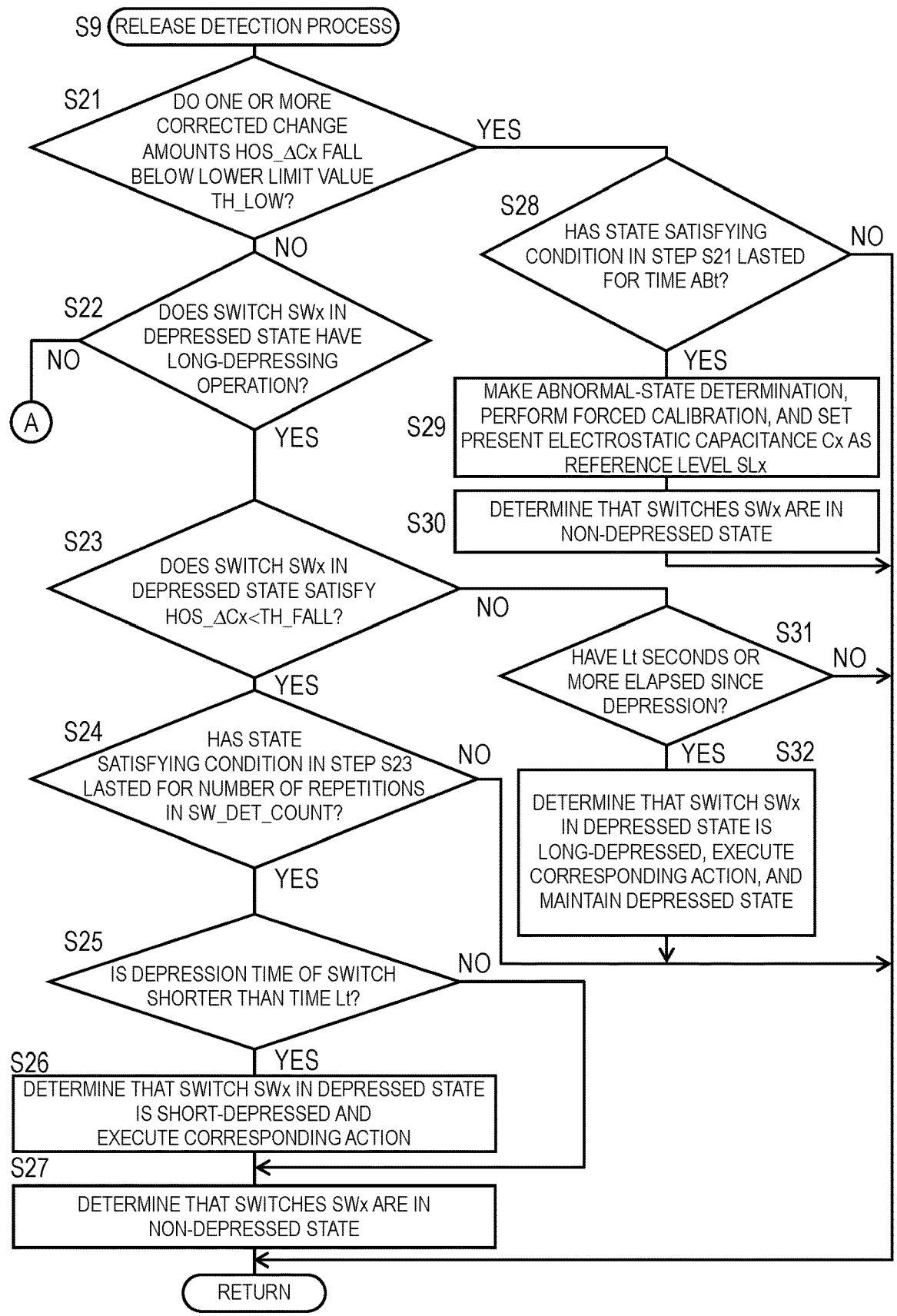
FIG. 10A is a flowchart of a first part of a subroutine of a release detection process (step S9) illustrated in FIG. 8.
Figure 10B:
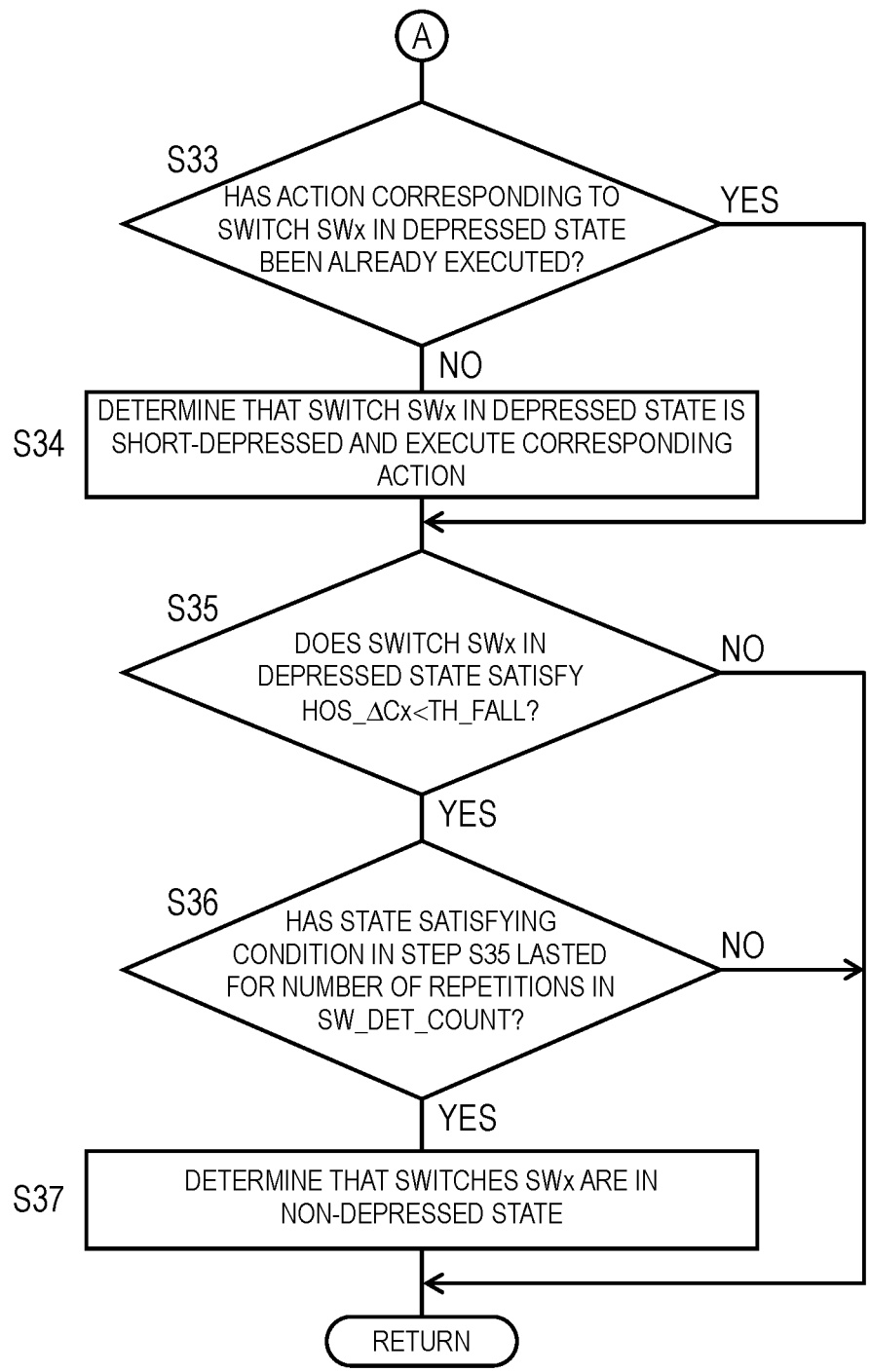
FIG. 10B is a flowchart of a second part of the subroutine of the release detection process (step S9) illustrated in FIG. 8.

FIGS. 10A and 10B are flowcharts of subroutines of the release detection process (step S9) illustrated in FIG. 8.

In step S21, depression detection circuit 21 determines whether one or more corrected change amounts HOS_$\Delta$Cx fall below threshold TH_LOW. When making a YES determination, depression detection circuit 21 proceeds to step S28, and when making a NO determination, depression detection circuit 21 proceeds to step S22.

In step S22 illustrated in FIG. 10A, depression detection circuit 21 determines whether switch SWx in the depressed state has a long-depressing operation. When making a YES determination, depression detection circuit 21 proceeds to step S23, and when making a NO determination, depression detection circuit 21 proceeds to step S33 illustrated in FIG. 10B. In step S23, depression detection circuit 21 determines whether switch SWx in the depressed state satisfies HOS_$\Delta$Cx<TH_FALL. When making a YES determination, depression detection circuit 21 proceeds to step S24, and when making a NO determination, depression detection circuit 21 proceeds to step S31. In step S24, depression detection circuit 21 determines whether a state satisfying the condition in step S23 has lasted for the number of repetitions in SW_DET_COUNT. When making a YES determination, depression detection circuit 21 proceeds to step S25, and when making a NO determination, depression detection circuit 21 returns to step S2 illustrated in FIG. 8. When making a YES determination in both steps S23 and S24, it can be seen that the user's finger is released from switch SWx. In step S25, depression detection circuit 21 determines whether a depression time of the switch is shorter than time Lt. When making a YES determination, depression detection circuit 21 proceeds to step S26, and when making a NO determination, depression detection circuit 21 proceeds to step S27. In step S26, depression detection circuit 21 determines that switch SWx in the depressed state has been short-depressed, and executes the corresponding action. Then, in step S27, depression detection circuit 21 determines that switches SWx are in the non-depressed state. After that, depression detection circuit 21 returns to step S2 illustrated in FIG. 8.

In step S33 illustrated in FIG. 10B, depression detection circuit 21 determines whether the action corresponding to switch SWx in the depressed state has been already executed. When making a YES determination, depression detection circuit 21 proceeds to step S35, and when making a NO determination, depression detection circuit 21 proceeds to step S34. In step S34, depression detection circuit 21 determines that switch SWx in the depressed state has been short-depressed, and executes the corresponding action. In steps S33 and S34, for switch SWx having only a short-depressing operation, the action corresponding to the switch is executed only when the release detection process is first executed after switch SWx has entered in the depressed state. In step S35, depression detection circuit 21 determines whether switch SWx in the depressed state satisfies HOS_$\Delta$Cx<TH_FALL. When making a YES determination, depression detection circuit 21 proceeds to step S36, and when making a NO determination, depression detection circuit 21 returns to step S2 illustrated in FIG. 8. In step S36, depression detection circuit 21 determines whether a state satisfying the condition in step S35 has lasted for the number of repetitions in SW_DET_COUNT. When making a YES determination, depression detection circuit 21 proceeds to step S37, and when making a NO determination, depression detection circuit 21 returns to step S2 illustrated in FIG. 8. When a YES determination is made in both steps S35 and S36, it can be seen that the user's finger is released from switch SWx. In step S37, depression detection circuit 21 determines that switches SWx are in the non-depressed state. After that, depression detection circuit 21 returns to step S2 illustrated in FIG. 8.

In step S28 illustrated in FIG. 10A, depression detection circuit 21 determines whether a state satisfying the condition in step S21 has lasted for time ABt. When making a YES determination, depression detection circuit 21 proceeds to step S29, and when making a NO determination, depression detection circuit 21 returns to step S2 illustrated in FIG. 8. In step S29, depression detection circuit 21 determines that the switch is in an abnormal state and performs forced calibration, and sets present electrostatic capacitance Cx as reference level SLx to register 21a. In step S30, depression detection circuit 21 determines that switches SWx are in the non-depressed state. After that, depression detection circuit 21 returns to step S2 illustrated in FIG. 8.

In step S31, depression detection circuit 21 determines whether Lt seconds or more have elapsed since the depression. When making a YES determination, depression detection circuit 21 proceeds to step S32, and when making a NO determination, depression detection circuit 21 returns to step S2 illustrated in FIG. 8. In step S32, depression detection circuit 21 determines that switch SWx in the depressed state has been long-depressed and executes the corresponding action, and maintains the depressed state. After that, depression detection circuit 21 returns to step S2 illustrated in FIG. 8.

Figure 13:
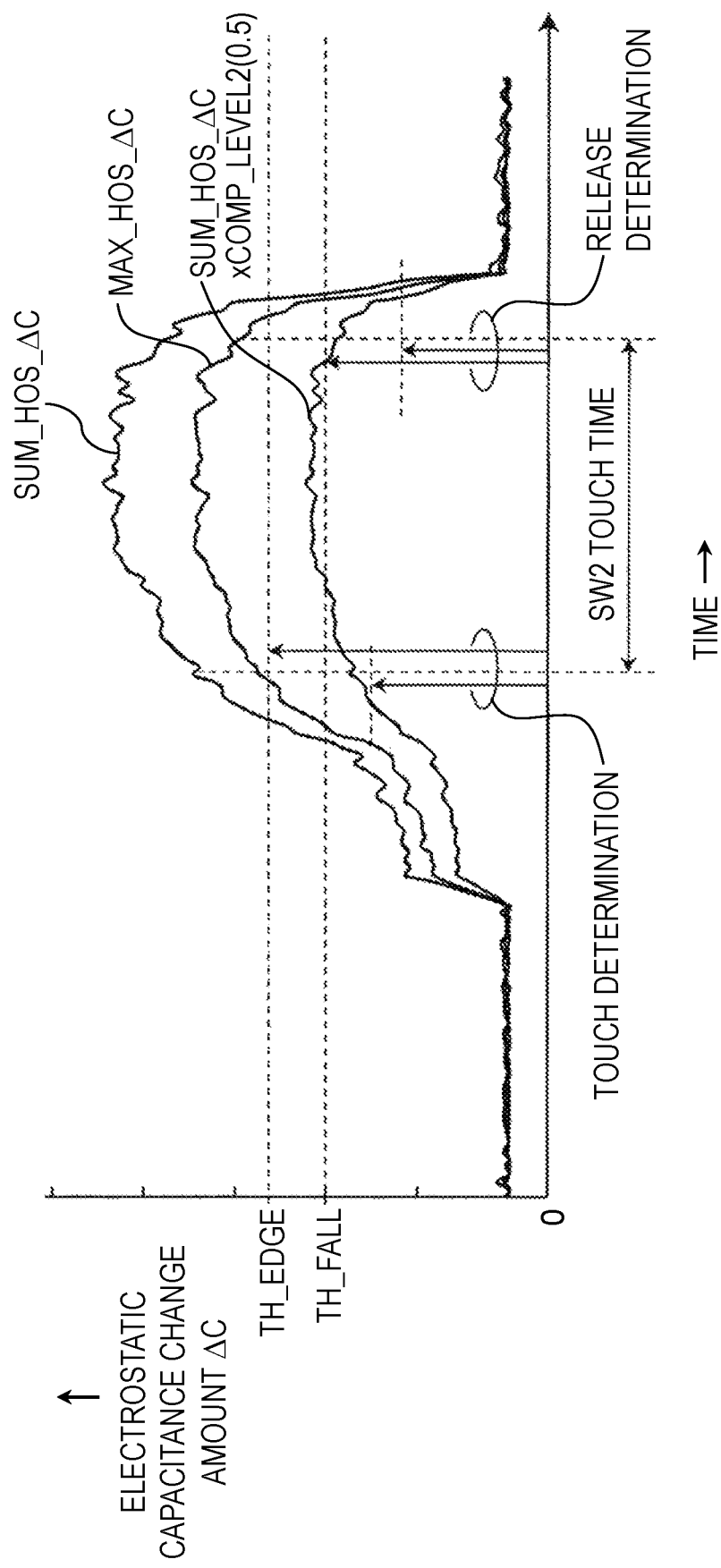
FIG. 13 is a graph illustrating temporal changes in electrostatic capacitance change amounts ΔC for describing touch determination in step S13 illustrated in FIG. 9 and release determination in step S23 illustrated in FIG. 10A.

FIG. 13 is a graph illustrating temporal changes in electrostatic capacitance change amounts $\Delta$C for describing touch determination in step S13 illustrated in FIG. 9 and release determination in step S23 illustrated in FIG. 10A. It is assumed that switch SW2 is depressed and corrected change amount HOS_$\Delta$C2 is maximum value MAX_HOS_$\Delta$C. In the touch determination, when maximum value MAX_HOS_$\Delta$C exceeds thresholds TH_EDGE and SUM_HOS_$\Delta$C×COMP_LEVEL2 and this state has lasted for the number of repetitions in SW_DET_COUNT, depression detection circuit 21 determines that switch SW2 is in the depressed state. When maximum value MAX_HOS_$\Delta$C falls below SUM_HOS_$\Delta$C×COMP_LEVEL2, depression detection circuit 21 regards that the switch is not correctly touched and does not determine that the switch is in the depressed state. In the release determination, after the touch determination, when a state in which corrected change amount HOS_$\Delta$C2 of switch SW2 falls below threshold TH_FALL for the number of repetitions in SW_DET_COUNT, depression detection circuit 21 determines that switch SW2 is in the non-depressed state.

In the switch device according to the first exemplary embodiment, including the configuration illustrated in FIGS.

2 to 6 and executing the processes illustrated in FIGS. 8 to 10B make it possible to detect a user input with higher accuracy than conventional.

Top plate 12 constituting the switch device may constitute part or all of the housing of electronic machine 1 illustrated in FIG. 1, or may be provided as another component.

Threshold TH_EDGE used in step S12 illustrated in FIG. 9 and threshold TH_FALL used in step S22 illustrated in FIG. 10A may be set independently from each other. Threshold SW_DET_COUNT used in step S14 illustrated in FIG. 9 and used in step S22 illustrated in FIG. 10A may also be set independently from each other.

As far as the sensitivities of switches SWx fully coincide with one another, correction coefficients HOSx may not be used but pre-correction change amounts ΔCx may be used instead of the corrected change amounts of switches SWx in the processes illustrated in FIGS. 8 to 10B.

To determine whether switches SW1 to SW6 are in the depressed state or in the non-depressed state, a determination method different from the method used in the processes illustrated in FIGS. 8 to 10B may be used. For example, when a state in which the capacitance change amount of a switch exceeds a pre-determined threshold and is twice or more larger than the maximum value of the capacitance change amounts of the other switches has lasted for a predetermined length of time, it is determined that the switch is depressed. The capacitance change amounts of switches may be change amounts of uncorrected capacitances or may be change amounts of corrected capacitances. In this manner, considering the capacitance change amounts of the other switches makes it possible to detect a user input with higher accuracy than conventional.

The determination on long-depression and short-depression and timings for long-depression and short-depression are decided according to the depressed time of switch SWx and product specifications.

Herein, top plate 12 will also be called "first electrode", electrodes E1 to E6 will also be called "second electrodes", and the depression detection circuit will also be called "detection circuit". Herein, the change amount and the corrected change amount will also be called "capacitance change amount". Herein, threshold TH_EDGE will also be called "first threshold", correction coefficient COMP_LEV-ELx will also be called "second threshold", threshold TH_FALL will also be called "third threshold", and threshold TH_LOW will also be called "fourth threshold". Herein, the time period of the number of repetitions in SW_DET_COUNT will also be called "first period" or "second period", the time period of threshold ABt will also be called "third period" or "fourth period".

[1-3. Advantageous effects]

The switch device and the electronic machine according to the first exemplary embodiment include the following configurations.

The switch device according to the first exemplary embodiment includes: top plate 12 that is formed from a metal plate; the plurality of electrodes E1 to E6 that is opposed to and capacitatively coupled to top plate 12; and depression detection circuit 21 that detects capacitances C1 to C6 between top plate 12 and the plurality of electrodes E1 to E6. The plurality of electrodes E1 to E6 and regions of top plate 12 opposed to electrodes E1 to E6 constitute the plurality of switches SW1 to SW6 that has capacitances changing due to depression of the regions of top plate 12 from top plate 12 toward electrodes E1 to E6. Depression detection circuit 21 calculates the capacitance change amounts of the capacitances of switches SW1 to SW6 indicating changes from the reference value. Depression detection circuit 21 calculates the maximum value and sum of the capacitance change amounts of switches SW1 to SW6. When the capacitance change amount of at least one switch of the plurality of switches SW1 to SW6 exceeds the first threshold and a state in which the ratio of the maximum value to the sum is equal to or greater than the second threshold has lasted for the first period, depression detection circuit 21 determines that switches SW1 to SW6 having the maximum value of the capacitance change amount is in the depressed state.

Accordingly, it is determined that the capacitance change amount of at least one switch exceeds the first threshold and that the state in which the ratio of the maximum value to the sum is equal to or greater than the second threshold has lasted for the first period, which makes it possible to detect the depressed state of the switch with higher accuracy than conventional.

In the switch device according to the first exemplary embodiment, when a state in which the capacitance change amounts of switches SW1 to SW6 having been judged as being in the depressed state are equal to or smaller than the third threshold has lasted for the second period, depression detection circuit 21 may determine that switches SW1 to SW6 having been judged as being in the depressed state are in the non-depressed state.

Accordingly, it is detected that the state in which the capacitance change amounts of switches SW1 to SW6 having been judged as being in the depressed state are equal to or smaller than the third threshold has lasted for the second period, which makes it possible to detect the non-depressed state of the switch with higher accuracy than conventional.

In the switch device according to the first exemplary embodiment, when a state in which the capacitance change amount of at least one switch of the plurality of switches SW1 to SW6 falls below a negative fourth threshold has lasted for the third period, depression detection circuit 21 may calibrate the reference value of the capacitance of the at least one of switches SW1 to SW6.

Accordingly, the reference value of the capacitances of switches SW1 to SW6 is calibrated, which makes it possible to detect a user input with further higher accuracy.

According to the switch device of the first exemplary embodiment, when the capacitance change amount of at least one switch SW of the plurality of switches SW1 to SW6 exceeds the first threshold and the state in which the ratio of the maximum value to the sum is smaller than the second threshold has lasted for the fourth period, depression detection circuit 21 may calibrate the reference value of the capacitance of at least switch SW1 to SW6.

Accordingly, the reference value of the capacitances of switches SW1 to SW6 is calibrated, which makes it possible to detect a user input with further higher accuracy.

In the switch device according to the first exemplary embodiment, the second threshold may be set independently to the plurality of switches SW1 to SW6 depending on which of the plurality of switches SW1 to SW6 has the maximum value of the capacitance change amount.

Accordingly, the second threshold is set independently to the plurality of switches SW1 to SW6, which makes it possible to detect a user input with further higher accuracy.

In the switch device according to the first exemplary embodiment, depression detection circuit 21 calculates the capacitance change amounts of switches SW1 to SW6 by multiplying differences between the capacitances of switches SW1 to SW6 and the reference value by the correction coefficient independently set to switches SW1 to SW6.

Accordingly, the correction coefficient is set independently to the plurality of switches SW1 to SW6, which makes it possible to detect a user input with further higher accuracy.

In the switch device according to the first exemplary embodiment, top plate 12 may be grounded.

In the switch device according to the first exemplary embodiment, the plurality of electrodes E1 to E6 may be aligned in a straight line with predetermined space between the electrodes.

In the switch device according to the first exemplary embodiment, the switch device may include dielectric members 31, 32, printed circuit board 33, and fixing member 34. Printed circuit board 33 has the first surface and the second surface. The first surface is opposed to top plate 12. Electrodes E1 to E6 are formed on the first surface. Dielectric members 31, 32 are provided between top plate 12 and printed circuit board 33, and are formed so as not to be in contact with the regions of top plate 12 opposed to electrodes E1 to E6. Fixing member 34 fixes printed circuit board 33 and dielectric members 31, 32 to top plate 12.

Accordingly, a hollow region is formed between top plate 12 and dielectric member 32, so that the regions of top plate 12 opposed to electrodes E1 to E6 are easy to depress from top plate 12 toward electrodes E1 to E6.

In the switch device according to the first exemplary embodiment, fixing member 34 may have a plurality of projections 34a that is formed to depress the second surface of printed circuit board 33 at positions opposed to outer peripheries of electrodes E1 to E6.

In the switch device according to the first exemplary embodiment, fixing member 34 may be screwed to top plate 12 at positions at equal distances from two adjacent electrodes among the plurality of electrodes E1 to E6.

This makes it less prone to prevent deformation of top plate 12 when switches SW1 to SW6 are depressed.

The switch device according to the first exemplary embodiment includes top plate 12 that is formed from a metal plate, the plurality of electrodes E1 to E6 that is opposed to and capacitatively coupled to top plate 12, and depression detection circuit 21 that detects capacitances C1 to C6 between top plate 12 and the plurality of electrodes E1 to E6. The switch device further includes dielectric members 31, 32, printed circuit board 33, and fixing member 34. Printed circuit board 33 has the first surface and the second surface. The first surface is opposed to top plate 12. Electrodes E1 to E6 are formed on the first surface. Dielectric members 31, 32 are provided between top plate 12 and printed circuit board 33, and are formed so as not to be in contact with the regions of top plate 12 opposed to electrodes E1 to E6. Fixing member 34 fixes printed circuit board 33 and dielectric members 31, 32 to top plate 12. The plurality of electrodes E1 to E6 and regions of top plate 12 opposed to electrodes E1 to E6 constitute the plurality of switches SW1 to SW6 that has capacitances changing due to depression of the regions of top plate 12 from top plate 12 toward electrodes E1 to E6.

Accordingly, the regions of top plate 12 opposed to electrodes E1 to E6 are easy to depress from top plate 12 toward electrodes E1 to E6, which makes it possible to detect the depressed state of the switch with higher accuracy than conventional.

An electronic machine according to the first exemplary embodiment includes the magical switch device; an electronic circuit that operates according to the depressed state and the non-depressed state of switches SW1 to SW6; and a housing at least part of which includes top plate 12 of the switch device.

The electronic machine according to one aspect of the present disclosure can detect a user input with higher accuracy than conventional.

The switch device according to one aspect of the present disclosure has no automatic drive mechanism and thus is less prone to become broken. In addition, the switch device according to one aspect of the present disclosure can implement an electronic machine having an outer appearance without projections and depressions due to switches.

2. Second Exemplary Embodiment

A switch device according to a second exemplary embodiment will be described with reference to FIGS. 14 to 17.

As described above, the flection amount of the top plate varies depending on the position of switch SWx, and thus switches SWx also vary in sensitivity. For example, the flection amount of the top plate may be different due to the difference in structure of the top plate near switches SWx. In relation to the second exemplary embodiment, description will be given as to a structure of the switch device that can reduce the differences in sensitivity among switches SWx even with a structural difference in the top plate.

[2-1. Configuration]

Figure 14:
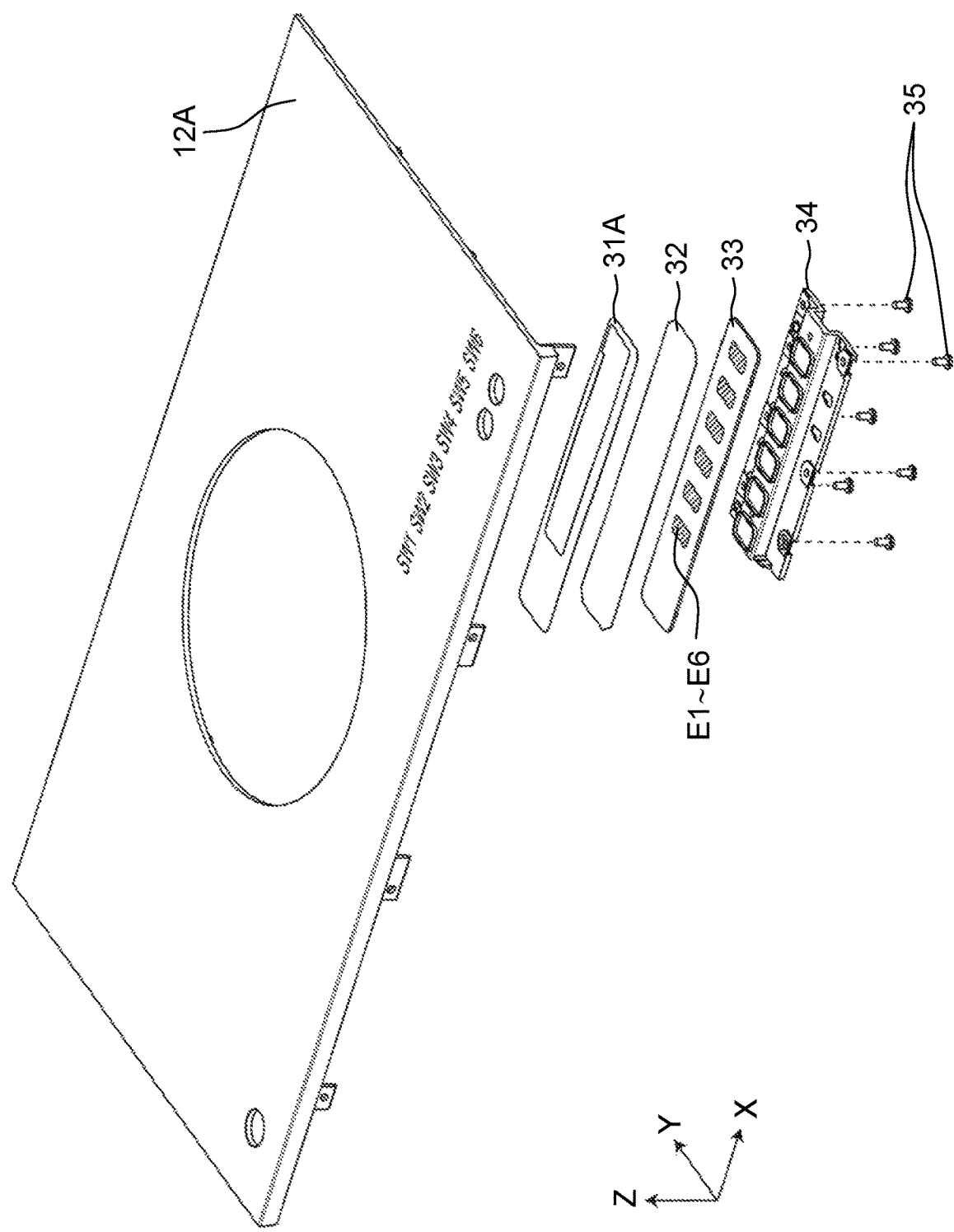
FIG. 14 is an exploded perspective view of constituent elements of a switch array of an electronic machine according to a second exemplary embodiment.

FIG. 14 is an exploded perspective view of constituent elements of a switch array of an electronic machine according to a second exemplary embodiment. The switch array illustrated in FIG. 14 includes top plate 12A varying in thickness depending on the position, in place of top plate 12 illustrated in FIG. 3. The switch array illustrated in FIG. 14 includes dielectric member 31A that is formed to reduce the differences in sensitivity among switches SWx, in place of dielectric member 31 illustrated in FIG. 3. In other points, the switch array illustrated in FIG. 14 is configured in the same manner as the switch array illustrated in FIG. 3.

Figure 15:
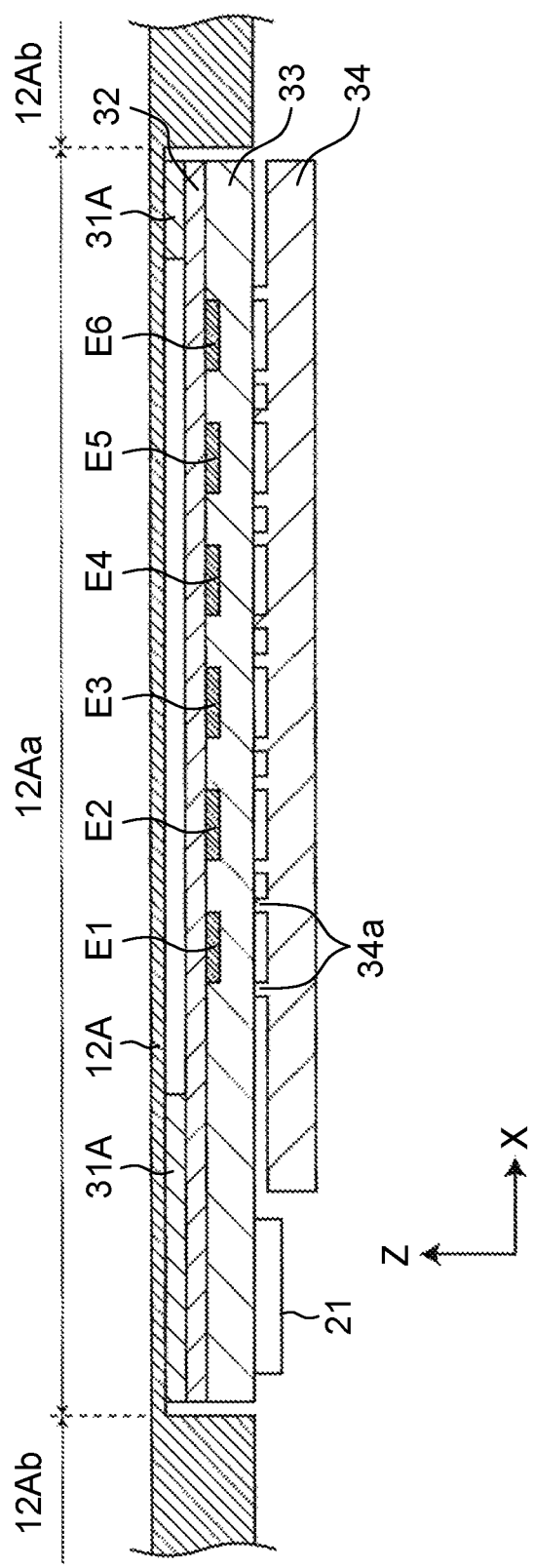
FIG. 15 is a cross-sectional view of part of cross section of the electronic machine according to the second exemplary embodiment.
Figure 16:
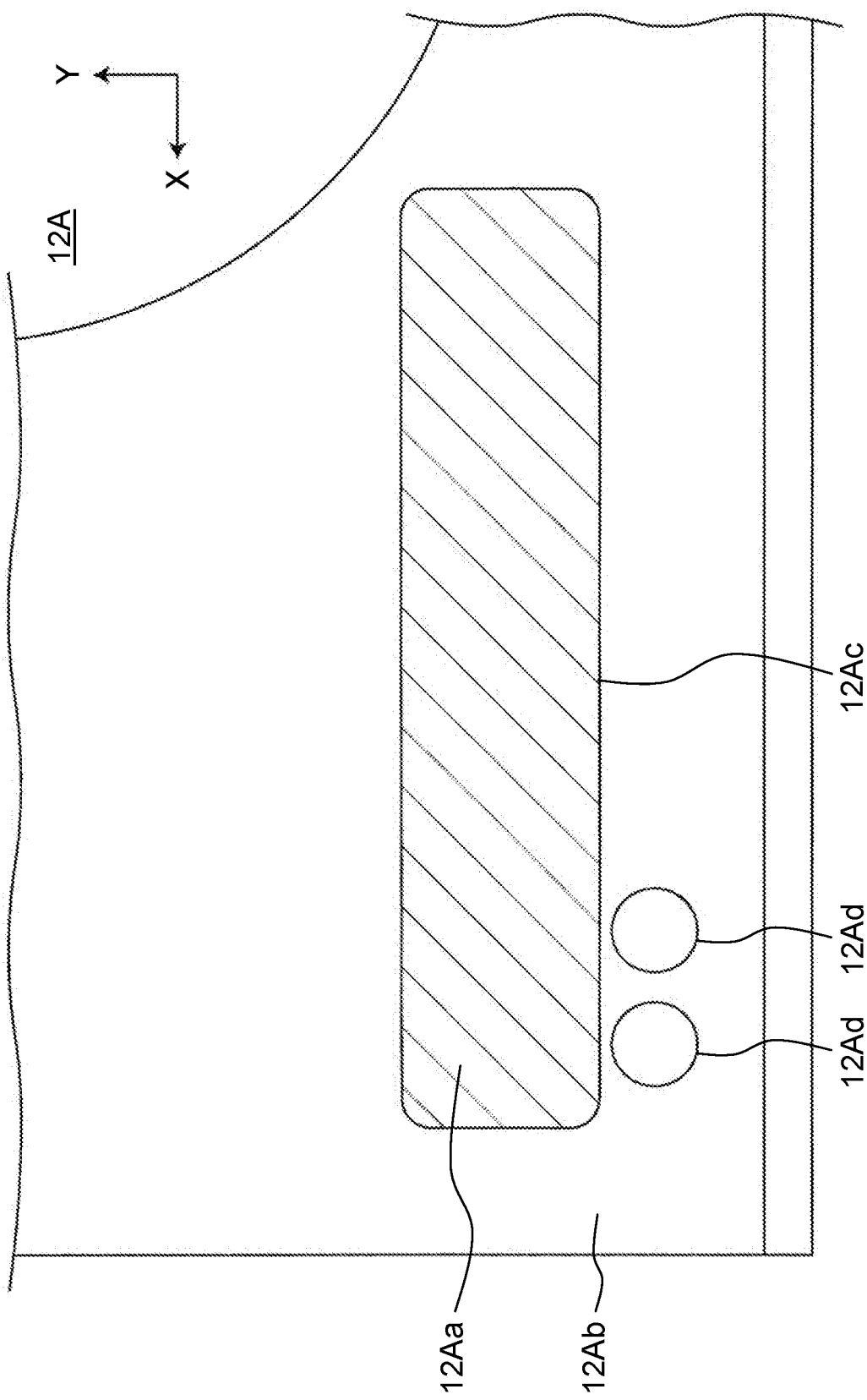
FIG. 16 is a bottom view of part of top plate 12A illustrated in FIG. 14.

FIG. 15 is a cross-sectional view of part of cross section of the electronic machine according to the second exemplary embodiment. FIG. 16 is a bottom view of part of top plate 12A illustrated in FIG. 14. Top plate 12A has first region 12Aa that is relatively thin and second region 12Ab that is relatively thick. As illustrated in FIG. 15, in region 12Aa, top plate 12A is opposed to dielectric members 31A, 32, printed circuit board 33, and fixing member 34. As illustrated in FIG. 16, region 12Ab surrounds region 12Aa. Contour 12Ac of region 12Aa is formed in accordance with contours of dielectric members 31A, 32 and printed circuit board 33 such that dielectric members 31A, 32 and printed circuit board 33 are accommodated in a recessed portion of region 12Aa. Top plate 12A has opening 12Ad in region 12Ab for operation of volume switch 15 illustrated in FIG. 1. Volume switch 15 is fixed to top plate 12A near opening 12Ad, for example.

Constituent elements such as circuits other than electrodes E1 to E6 may be provided on printed circuit board 33. For example, as illustrated in FIG. 15, depression detection circuit 21 may be provided on printed circuit board 33.

Figure 17:
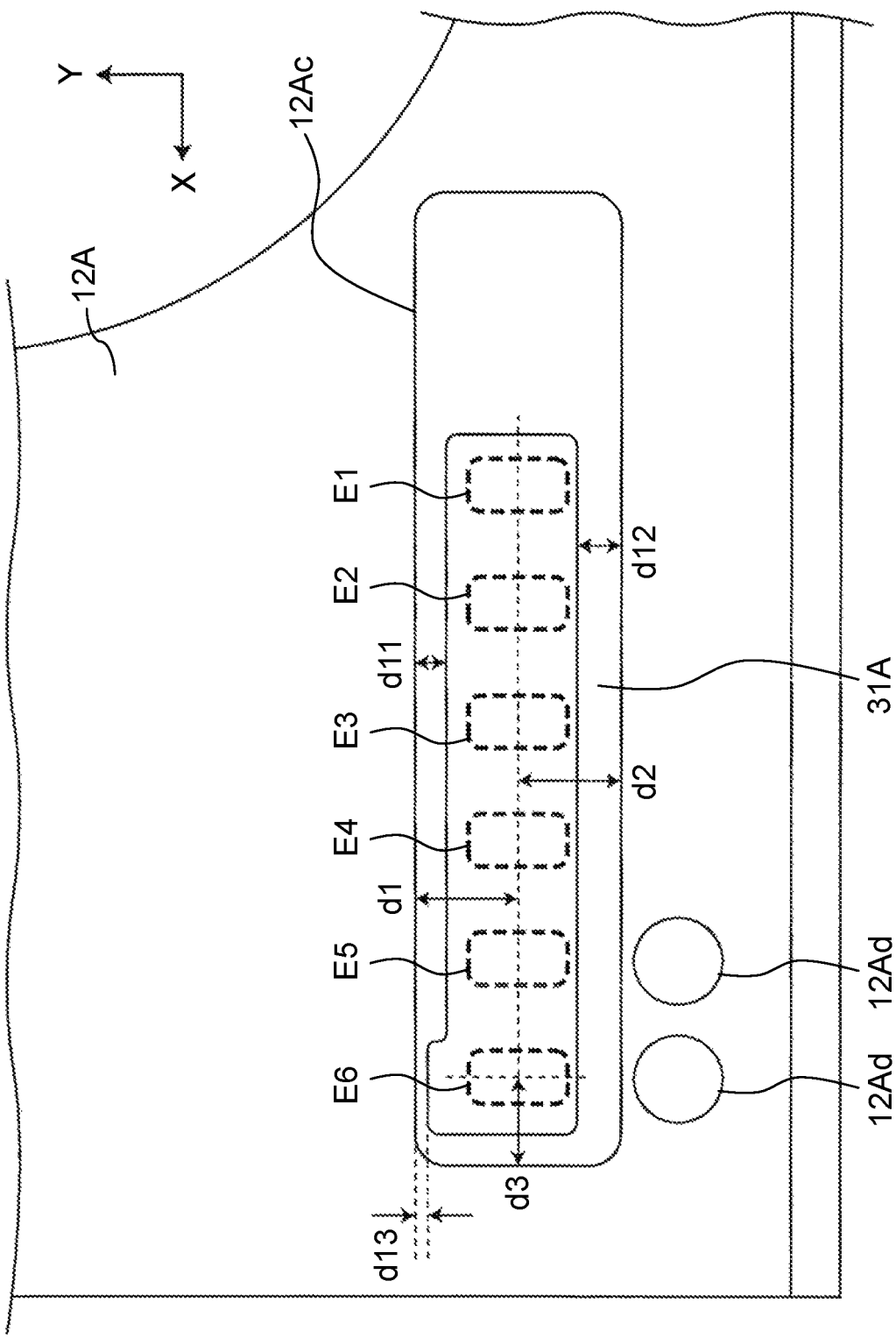
FIG. 17 is a bottom view of top plate 12A illustrated in FIG. 16 on which dielectric member 31A illustrated in FIG. 14 is disposed.

FIG. 17 is a bottom view of top plate 12A illustrated in FIG. 16 on which dielectric member 31A illustrated in FIG. 14 is disposed.

FIG. 17 illustrates positions of electrodes E1 to E6 in the assembled switch array by thick dot lines. In FIG. 17, distance d1 indicates a distance from a center of each of electrodes E1 to E6 to a top side of contour 12Ac (that is, a distance from each of electrodes E1 to E6 to region 12Ab above each of electrodes E1 to E6). Distance d2 indicates a distance from the center of each of electrodes E1 to E6 to a bottom side of contour 12Ac (that is, a distance from each of electrodes E1 to E6 to region 12Ab below each of electrodes E1 to E6). Distance d3 indicates a distance from the center of electrode E6 to a left side of contour 12Ac (that is, a distance from electrode E6 to region 12Ab on the left side of electrode E6). Distances d11 to d13 indicate widths of dielectric member 31A in a ring shape at different places (that is, a distance between an inner periphery and an outer periphery of dielectric member 31A).

FIGS. 16 and 17 do not illustrate structural objects on top plate 12 for receiving screws 35 illustrated in FIG. 5 for the sake of simplicity.

[2-2. Operations]

In the example of FIG. 17, distance d3 is shorter than distances d1 and d2. In other words, electrode E6 is provided nearer region 12Ab than other electrodes E1 to E5. The region of top plate 12A opposed to electrode E6 may be unlikely to bend than the regions of top plate 12A opposed to other electrodes E1 to E5 due to proximity to region 12Ab that is relatively thick. As a result, the sensitivity of switch SW6 including electrode E6 may be lower than the sensitivities of switches SW1 to SW5 including other electrodes E1 to E5. In contrast to this, to improve the sensitivity of switch SW6 including electrode E6, dielectric member 31A is formed to have a wider region near electrode E6 not in contact with top plate 12A than near other electrodes E1 to E5. In the example of FIG. 17, a width of dielectric member 31A above electrode E6 (distance d13) is made smaller than widths of dielectric member 31A in other places (distances d11 and d12). Specifically, above electrodes E1 to E6, the distance from the center of electrode E6 to an inner periphery of dielectric member 31A is longer than distances from the centers of other electrodes E1 to E5 to the inner periphery of dielectric member 31A (d1-d13>d1-d11). Accordingly, near electrode E6, the region of dielectric member 31A not in contact with top plate 12A is made wider. In this manner, widening the region of dielectric member 31A not in contact with top plate 12A near electrode E6 makes it possible to improve flexibility of the region of top plate 12A opposed to electrode E6. This improves the sensitivity of switch SW6 including electrode E6.

In addition, when volume switch 15 is operated, top plate 12A becomes deformed near opening 12Ad and the capacitances of switches SW1 to SW6 may change due to the deformation of top plate 12A. Therefore, dielectric member 31A is required to be unlikely to come under influence of deformation of top plate 12A except for the depression of switches SW1 to SW6. Accordingly, dielectric member 31A is formed such that a portion of dielectric member 31A near opening 12Ad has a wider region in contact with top plate 12A than the other portions of dielectric member 31A. In the example of FIG. 17, opening 12Ad (and volume switch 15) is provided under electrodes E1 to E6 so that the width of dielectric member 31A under electrodes E1 to E6 (distance d12) is larger than widths of dielectric member 31A in the other places (distances d11 and d13). Specifically, the distance from the centers of electrodes E1 to E6 under electrodes E1 to E6 to the inner periphery of dielectric member 31A is shorter than the distances corresponding to the other places (for example, above electrodes E1 to E6) (d2-d12<d1-d11). Accordingly, near opening 12Ad (and volume switch 15), the region of dielectric member 31A in contact with top plate 12A is widened. In this manner, widening the region of dielectric member 31A in contact with top plate 12A under electrodes E1 to E6 makes the regions of top plate 12A opposed to electrodes E1 to E6 less prone to bend. This makes dielectric member 31A unlikely to come under influence of deformation of top plate 12A except for the depression of switches SW1 to SW6.

Volume switch 15 may be fixed to not top plate 12A but a device inside electronic machine 1. Also in this case, when the user operates volume switch 15, the user's finger may be brought into contact with a portion near opening 12Ad, thereby to deform top plate 12A. In addition, when CD drive 23 illustrated in FIG. 2 is fixed to top plate 12A, top plate 12A may become deformed due to vibration generated from CD drive 23. Further, when electronic machine 1 is a portable device, a grip may be provided on top plate 12A near switches SW1 to SW6 for the user to hold electronic machine 1. In this case, top plate 12A may become deformed when the user holds the grip. Accordingly, in addition to volume switch 15 and opening 12Ad, top plate 12A may have various structural objects in region 12Ab related to deformation of top plate 12A varying over time. According to the present exemplary embodiment, forming dielectric member 31A suited to the positions of the structural objects makes dielectric member 31A less prone to come under influence of deformation of top plate 12A except for the depression of switches SW1 to SW6.

[2-3. Advantageous effects]

The switch device according to the second exemplary embodiment includes the configurations below.

In the switch device according to the second exemplary embodiment, top plate 12A may have first region 12Aa opposed to printed circuit board 33 and second region 12Ab surrounding first region 12Aa. In this case, a thickness of second region 12Ab is larger than a thickness of first region 12Aa.

This makes region 12Aa opposed to electrodes E1 to E6 prone to bend than region 12Ab.

In the switch device according to the second exemplary embodiment, one of the plurality of electrodes E1 to E6 may be provided nearer second region 12Ab than the other electrodes. In this case, dielectric member 31A is formed to have a wider region not in contact with top plate 12A near the electrode in proximity to second region 12Ab than near the other electrodes.

Accordingly, when the region of top plate 12A opposed to any of electrodes E1 to E6 may be less prone to bend due to the structure of top plate 12A, dielectric member 31A can be formed to improve the flexibility of the region, thereby to maintain the sensitivities of switches SW1 to SW6.

In the switch device according to the second exemplary embodiment, top plate 12A may have structural object 12Ad related to the deformation of top plate 12A varying over time in second region 12Ab. In this case, dielectric member 31A is formed such that a portion of dielectric member 31A near structural object 12Ad has a wider region in contact with top plate 12A than the other portions of dielectric member 31A.

Accordingly, even when dielectric member 31A may come under the influence of deformation of top plate 12A except for the depression of switches SW1 to SW6 due to the structure of top plate 12A, dielectric member 31A can be formed in such a manner as to be less prone to come under influence of the deformation, thereby maintaining the sensitivities of switches SW1 to SW6.

3. Third Exemplary Embodiment

A switch device according to a third exemplary embodiment will be described with reference to FIGS. 18 to 20.

[3-1. Configuration]

The switch device according to the third exemplary embodiment is configured in the same manner as the switch device according to the first or second exemplary embodiment. Hereinafter, the switch device according to the third exemplary embodiment will be described on the assumption that the switch device is configured in the same manner as the switch device according to the first exemplary embodiment.

[3-2. Operations]

Figure 18:
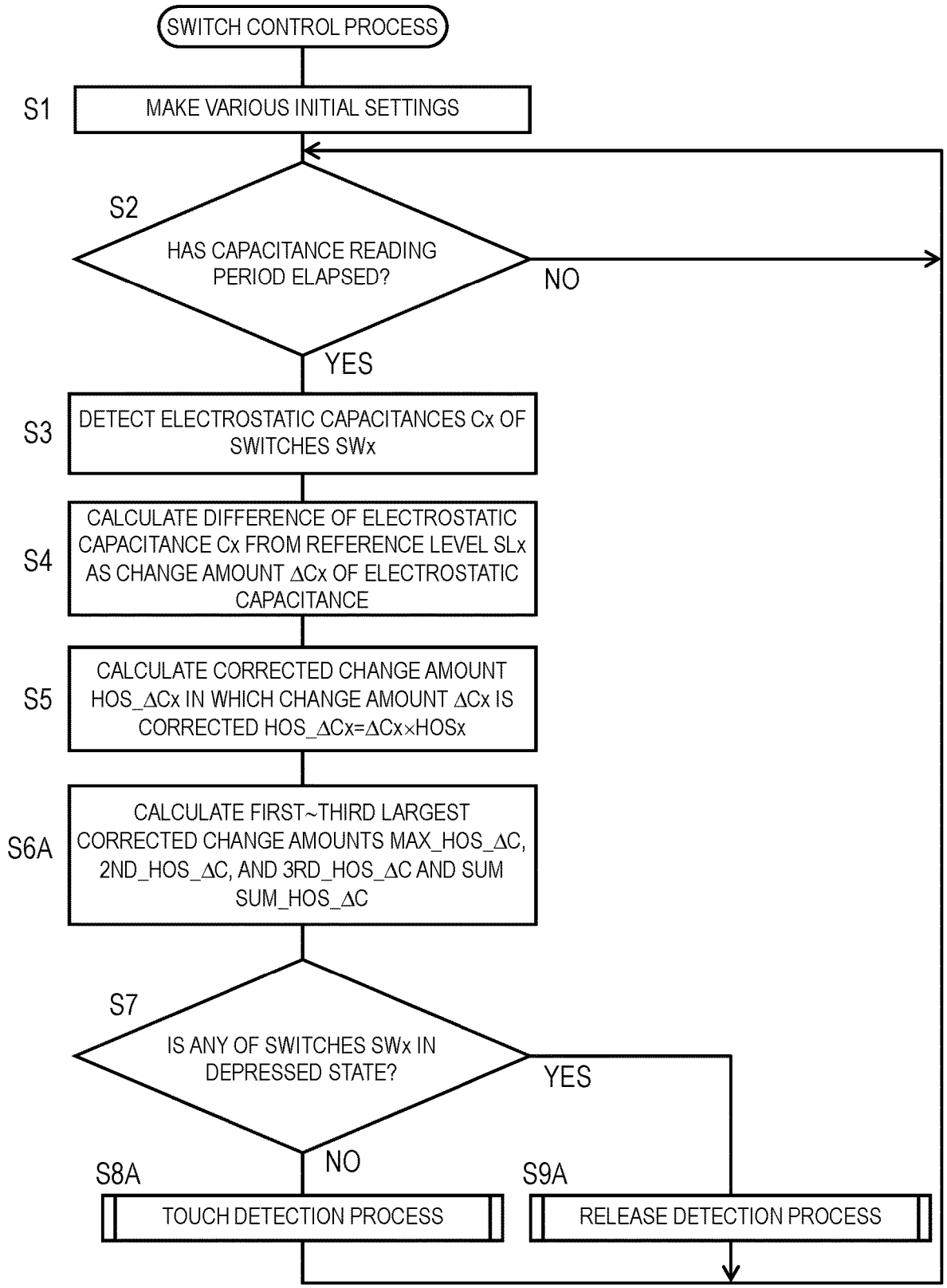
FIG. 18 is a flowchart of a switch control process executed by depression detection circuit 21 of electronic machine 1 according to a third exemplary embodiment.

FIG. 18 is a flowchart of a switch control process executed by depression detection circuit 21 of electronic machine 1 according to a third exemplary embodiment. In FIG. 18, the steps with the same reference signs as those in FIG. 8 indicate the same processes described above in relation to the first exemplary embodiment.

In a switch control process illustrated in FIG. 18, the same parameters ΔCx, HOS_ΔCx, MAX_HOS_ΔC, and SUM_HOS_ΔC as those in the switch control process illustrated in FIG. 8 are used. Further, in the switch control process illustrated in FIG. 18, among corrected change amounts HOS_ΔCx, parameters indicating second largest corrected change amount 2ND_HOS_ΔC and third largest corrected change amount 3RD_HOS_ΔC are used.

Sum SUM_HOS_ΔC of corrected change amounts HOS_ΔCx may be calculated as a sum of absolute values of corrected change amounts HOS_ΔCx including corrected change amounts having negative values. Counting in the corrected change amounts having negative values makes it possible to detect a change in the electrostatic capacitance due to depression of a region other than switches SW1 to SW6 of top plate 12, whereby false detection of switches SW1 to SW6 becomes less prone to occur.

In step S1, depression detection circuit 21 makes various initial settings using the same thresholds and correction coefficients as described above in relation to the first exemplary embodiment. However, the thresholds and the correction coefficients may have values different from the values exemplified in relation to the first exemplary embodiment. For example, threshold TH_EDGE may be set to 80, threshold TH_FALL may be set to 80, and threshold TH_LOW may be set to −80.

In the switch control process illustrated in FIG. 18, depression detection circuit 21 executes step S6A instead of step S6 illustrated in FIG. 8. In step S6A, among corrected change amounts HOS_ΔCx, depression detection circuit 21 determines first to third largest corrected change amounts MAX_HOS_ΔC, 2ND_HOS_ΔC, and 3RD_HOS_ΔC. Further, depression detection circuit 21 calculates sum SUM_HOS_ΔC of corrected change amounts HOS_ΔCx.

In the switch control process illustrated in FIG. 18, depression detection circuit 21 executes steps S8A, S9A instead of steps S8, S9 illustrated in FIG. 8.

Figure 19:
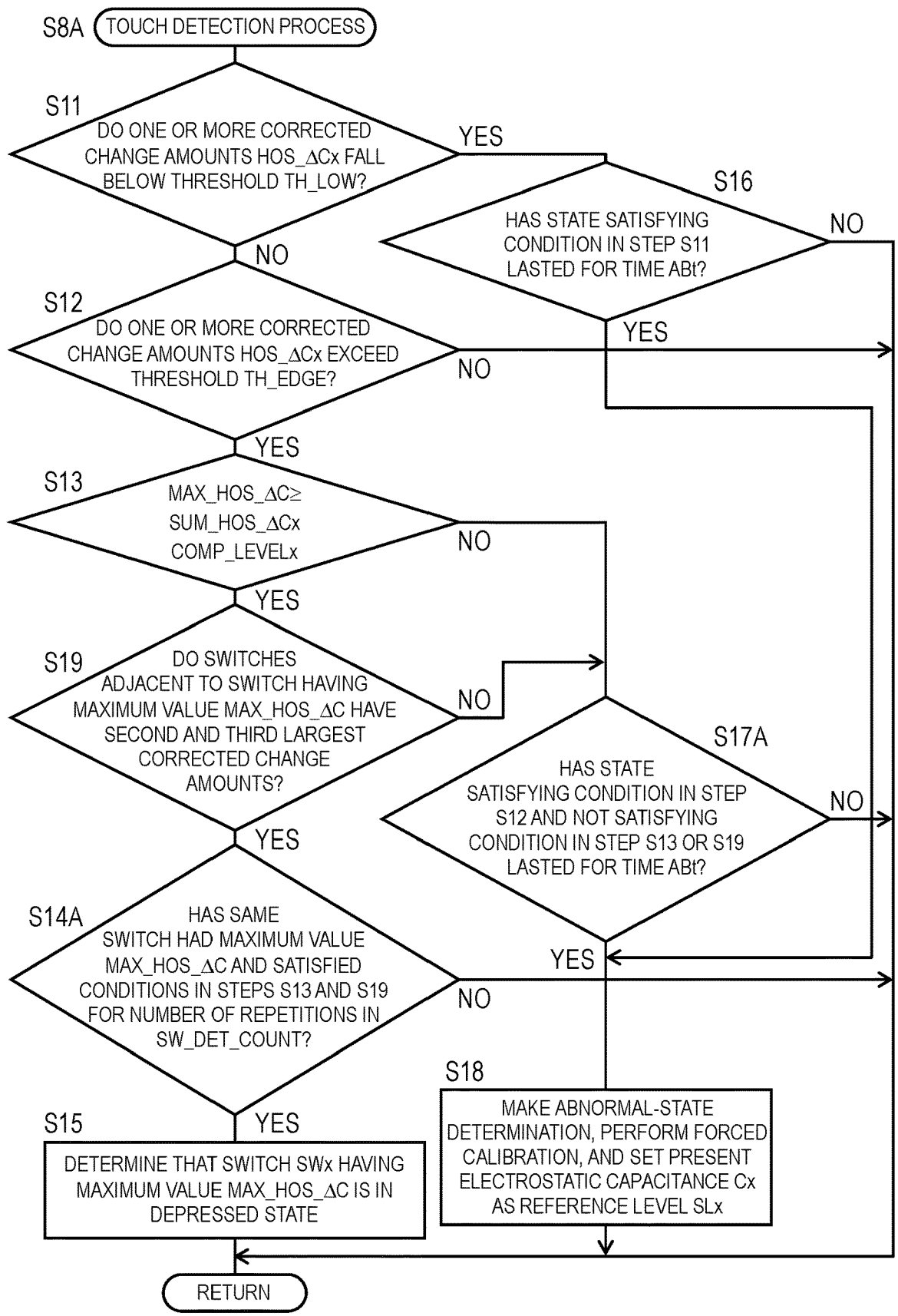
FIG. 19 is a flowchart of a subroutine of touch detection process (step S8A) illustrated in FIG. 18.

FIG. 19 is a flowchart of a subroutine of a touch detection process (step S8A) illustrated in FIG. 18. In FIG. 19, the steps with the same reference signs as those in FIG. 9 indicate the same processes described above in relation to the first exemplary embodiment.

When making a YES determination in step S13, depression detection circuit 21 proceeds to step S19. In step S19, depression detection circuit 21 determines whether the switches adjacent to the switch having maximum value MAX_HOS_ΔC have second and third largest corrected change amounts 2ND_HOS_ΔC and 3RD_HOS_ΔC. According to the structure of the switch array, when certain switch SWx is correctly depressed, switch SWx should have the maximum corrected change amount, and the adjacent switches should have the second and third largest corrected change amounts. When making a YES determination in step S19, depression detection circuit 21 determines that the switch having maximum value MAX_HOS_ΔC is correctly depressed. Otherwise, depression detection circuit 21 determines that this detection is false. When one of switches SW1 and SW6 on both sides of the switch array has maximum value MAX_HOS_ΔC, depression detection circuit 21 determines whether the adjacent switch has second largest corrected change amount 2ND_HOS_ΔC. When making a YES determination in step S19, depression detection circuit 21 proceeds to step S14A, and when making a NO determination, depression detection circuit 21 proceeds to step S17A.

Depression detection circuit 21 may execute step S19 on only some of switches S1 to SW6 that are considered as being prone to be falsely detected.

In a touch detection process illustrated in FIG. 19, depression detection circuit 21 executes step S14A instead of step S14 illustrated in FIG. 9. In step S14A, depression detection circuit 21 determines whether the same switch SWx has maximum value MAX_HOS_ΔC and satisfies the conditions in steps S13 and S19 for the number of repetitions in SW_DET_COUNT. Executing step S14A makes it possible to detect a state in which it can be determined that switch SWx is correctly depressed. When making a YES determination in step S14A, depression detection circuit 21 proceeds to step S15, and when making a NO determination, depression detection circuit 21 returns to step S2 illustrated in FIG. 18.

In the touch detection process illustrated in FIG. 19, depression detection circuit 21 executes step S17A instead of step S17 illustrated in FIG. 9. In step S17A, depression detection circuit 21 determines whether a state in which the condition in step S12 is satisfied and the condition in step S13 or S19 is not satisfied has lasted for time ABt. When making a YES determination in step S17A, depression detection circuit 21 proceeds to step S18, and when making a NO determination, depression detection circuit 21 returns to step S2 illustrated in FIG. 18.

Figure 20:
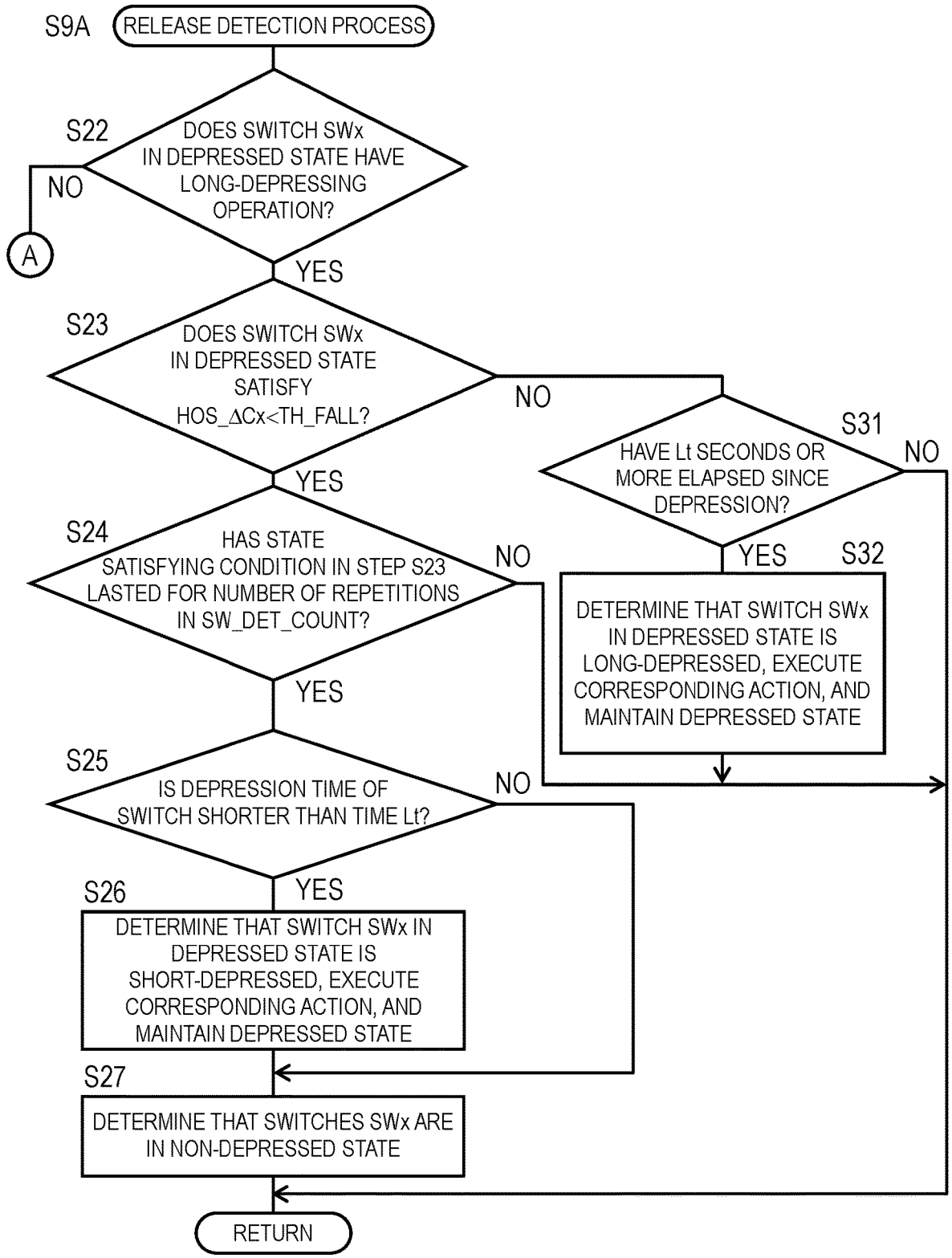
FIG. 20 is a flowchart of a subroutine of release detection process (step S9A) illustrated in FIG. 18.

FIG. 20 is a flowchart of a subroutine of release detection process (step S9A) illustrated in FIG. 18. In FIG. 20, the steps with the same reference signs as those in FIG. 10A indicate the same processes described above in relation to the first exemplary embodiment. When making a NO determination in step S22, depression detection circuit 21 executes steps S33 to S37 illustrated in FIG. 10B, and then returns to step S2 illustrated in FIG. 18. As illustrated in FIG. 20, steps S21 and S28 to S30 illustrated in FIG. 10A may be omitted.

[3-3. Advantageous effects]

The switch device according to the third exemplary embodiment includes the configurations below.

In the switch device according to the third exemplary embodiment, depression detection circuit 21 determines the second and third largest capacitance change amounts out of the capacitance change amounts of the switches. When the capacitance change amount of at least one switch of the plurality of switches exceeds the first threshold and a state in which the ratio of the maximum value to the sum is equal to or greater than the second threshold and the switches adjacent to the switch having the maximum value of the capacitance change amount have the second and third largest capacitance change amounts has lasted for the first period, depression detection circuit 21 determines that the switch having the maximum value of the capacitance change amount is in the depressed state.

This makes it possible to detect the state in which it can be determined that switch SWx is correctly depressed.

Other Exemplary Embodiments

Exemplary embodiments have been described so far as examples of the technique disclosed in the present application. However, the technique of the present disclosure can be applied not only to the above exemplary embodiments but also to exemplary embodiments in which modification, replacement, addition, or omission is appropriately made. In addition, new exemplary embodiments can be made by combining the constituent elements described in relation to the foregoing exemplary embodiments.

As described above, the exemplary embodiment has been described as an example of a technique according to the present disclosure. For that purpose, the accompanying drawings and detailed descriptions have been provided.

Accordingly, the constituent elements described in the accompanying drawings and the detailed description may include not only the constituent elements essential for solving the problem but also constituent elements that are not essential for solving the problem in order to illustrate the technique. It should not be therefore determined that the unessential constituent elements in the accompanying drawings and the detailed description are essential only based on the fact that these constituent elements are included in the drawings and the description.

Moreover, since the above exemplary embodiments exemplify the technique in the present disclosure, various modifications, substitutions, additions and omissions can be performed within the scope of claims and equivalent scope of claims.

The invention claimed is:

1. A switch device comprising:
a first electrode that is formed from a metal plate;
a plurality of second electrodes that is opposed to and capacitively coupled to the first electrode;
a detection circuit that detects capacitances between the first electrode and the plurality of second electrodes;
a printed circuit board that has a first surface and a second surface, the first surface being opposed to the first electrode and having the second electrodes; and
a dielectric member that is provided between the first electrode and the printed circuit board and is formed in such a manner as not to contact regions of the first electrode opposed to the second electrodes and to contact the first electrode around the regions,
wherein the plurality of second electrodes and the regions of the first electrode opposed to the second electrodes constitute a plurality of switches that has the capacitances varying when the regions of the first electrode are depressed from the first electrode toward the second electrodes,
wherein the first electrode has a first region opposed to the printed circuit board and a second region surrounding the first region, and a thickness of the second region is larger than a thickness of the first region, and
wherein the first electrode has an opening, and the dielectric member is formed such that a portion of the dielectric member near the opening has a wider region in contact with the first electrode than the other portions of the dielectric member.

2. The switch device according to claim 1, wherein one of the plurality of second electrodes is provided nearer the second region than the other second electrodes, and the dielectric member is formed in proximity to the second electrode near the second region in such a manner as to have a wider region not in contact with the first electrode than near the other second electrodes.

3. A switch device comprising:
a first electrode that is formed from a metal plate;
a plurality of second electrodes that is opposed to and capacitively coupled to the first electrode; and
a detection circuit that detects capacitances between the first electrode and the plurality of second electrodes,
wherein
the plurality of second electrodes and regions of the first electrode opposed to the second electrodes constitute a plurality of switches that has the capacitances varying when the regions of the first electrode are depressed from the first electrode toward the second electrodes, and
the detection circuit
calculates capacitance change amounts indicating changes of the capacitances of the switches from a reference value,
calculates a maximum value and a sum of the capacitance change amounts of the switches, and
when the capacitance change amount of at least one switch of the plurality of switches exceeds a first threshold and a state in which a ratio of the maximum value to the sum is equal to or greater than a second threshold lasts for a first period, determines that the switch with the maximum value of the capacitance change amount is in a depressed state.

4. The switch device according to claim 3, wherein
the detection circuit determines second and third largest capacitance change amounts out of the capacitance change amounts of the switches, and
when the capacitance change amount of at least one switch of the plurality of switches exceeds the first threshold and a state in which the ratio of the maximum value to the sum is equal to or greater than the second threshold and the switches adjacent to the switch having the maximum value of the capacitance change amount have the second and third largest capacitance change amounts lasts for the first period, the detection circuit determines that the switch having the maximum value of the capacitance change amount is in the depressed state.

5. The switch device according to claim 3, wherein, when a state in which the capacitance change amounts of the switches having been judged as being in the depressed state are equal to or smaller than the third threshold has lasted for a second period, the detection circuit determines that the switches having been judged as being in the depressed state are in a non-depressed state.

6. The switch device according to claim 3, wherein, when a state in which the capacitance change amount of at least one switch of the plurality of switches falls below a negative fourth threshold lasts for a third period, the detection circuit calibrates the reference value of the capacitance of the at least one switch.

7. The switch device according to claim 3, wherein, when the capacitance change amount of at least one switch of the plurality of switches exceeds the first threshold and a state in which the ratio of the maximum value to the sum is smaller than the second threshold lasts for a fourth period, the detection circuit calibrates the reference value of the capacitance of the at least one switch.

8. The switch device according to claim 3, wherein the second threshold is set independently to the plurality of switches depending on which of the plurality of switches has the maximum value of the capacitance change amount.

9. The switch device according to claim 3, wherein the detection circuit calculates the capacitance change amounts of the switches by multiplying differences between the capacitances of the switches and the reference value by correction coefficients independently set to the switches.

10. The switch device according to claim 3, wherein the first electrode is grounded.

11. The switch device according to claim 3, wherein the plurality of second electrodes is aligned in a straight line with predetermined space between the electrodes.

12. The switch device according to claim 11, comprising:
a printed circuit board that has a first surface and a second surface, the first surface being opposed to the first electrode and having the second electrodes;
a dielectric member that is provided between the first electrode and the printed circuit board and is formed in such a manner as not to be in contact with regions of the first electrode opposed to the second electrodes; and
a fixing member that fixes the printed circuit board and the dielectric member to the first electrode.

13. The switch device according to claim 12, wherein the fixing member has a plurality of projections that is formed to depress the second surface of the printed circuit board at positions opposed to outer peripheries of the second electrodes.

14. The switch device according to claim 12, wherein the fixing member is screwed into the first electrode at positions at equal distances from two adjacent electrodes of the plurality of second electrodes.

15. The switch device according to claim 12, wherein
the first electrode has a first region opposed to the printed circuit board and a second region surrounding the first region, and
a thickness of the second region is larger than a thickness of the first region.

16. The switch device according to claim 15, wherein
one of the plurality of second electrodes is provided nearer the second region than the other second electrodes, and
the dielectric member is formed in proximity to the second electrode near the second region in such a manner as to have a wider region not in contact with the first electrode than near the other second electrodes.

17. The switch device according to claim 15, wherein
the first electrode has an opening, and
the dielectric member is formed such that a portion of the dielectric member near the opening has a wider region in contact with the first electrode than the other portions of the dielectric member.

18. An electronic machine comprising:
the switch device including:
a first electrode that is formed from a metal plate;
a plurality of second electrodes that is opposed to and capacitively coupled to the first electrode; and
a detection circuit that detects capacitances between the first electrode and the plurality of second electrodes, wherein
the plurality of second electrodes and regions of the first electrode opposed to the second electrodes constitute a plurality of switches that has the capacitances varying when the regions of the first electrode are depressed from the first electrode toward the second electrodes, and
the detection circuit
calculates capacitance change amounts indicating changes of the capacitances of the switches from a reference value,
calculates a maximum value and a sum of the capacitance change amounts of the switches, and
when the capacitance change amount of at least one switch of the plurality of switches exceeds a first threshold and a state in which a ratio of the maximum value to the sum is equal to or greater than a second threshold lasts for a first period, determines that the switch with the maximum value of the capacitance change amount is in a depressed state;
an electronic circuit that operates depending on the depressed state and the non-depressed state of the switches in the switch device; and
a housing at least part of which includes the first electrode in the switch device.

19. A switch device, comprising:
a first electrode that is formed from a metal plate;
a plurality of second electrodes that is opposed to and capacitively coupled to the first electrode;
a detection circuit that detects capacitances between the first electrode and the plurality of second electrodes;
a printed circuit board that has a first surface and a second surface, the first surface being opposed to the first electrode and having the second electrodes; and
a dielectric member that is provided between the first electrode and the printed circuit board and is formed in such a manner as not to contact regions of the first electrode opposed to the second electrodes, wherein
the plurality of second electrodes and the regions of the first electrode opposed to the second electrodes constitute a plurality of switches that has the capacitances varying when the regions of the first electrode are depressed from the first electrode toward the second electrodes,
the first electrode has a first region opposed to the printed circuit board and a second region surrounding the first region,
a thickness of the second region is larger than a thickness of the first region,
one of the plurality of second electrodes is provided nearer the second region than the other second electrodes, and
the dielectric member is formed in proximity to the second electrode near the second region in such a manner as to have a wider region not in contact with the first electrode than near the other second electrodes.

* * * * *